United States Patent
Iwamoto et al.

(10) Patent No.: US 7,941,103 B2
(45) Date of Patent: May 10, 2011

(54) DUPLEXER

(75) Inventors: Yasuhide Iwamoto, Kawasaki (JP); Jun Tsutsumi, Kawasaki (JP); Masafumi Iwaki, Kawasaki (JP); Masanori Ueda, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 739 days.

(21) Appl. No.: 11/598,570

(22) Filed: Nov. 14, 2006

(65) Prior Publication Data
US 2007/0111674 A1 May 17, 2007

(30) Foreign Application Priority Data
Nov. 15, 2005 (JP) ................. 2005-330335

(51) Int. Cl.
H04B 1/44 (2006.01)

(52) U.S. Cl. .......... 455/78; 455/82; 455/83; 455/193.2; 333/129; 333/132; 333/193

(58) Field of Classification Search .............. 455/78, 455/82, 83, 550.1, 193.2; 333/129, 133, 333/154, 175, 13, 195, 197–201, 212, 219
See application file for complete search history.

(56) References Cited

U.S. PATENT DOCUMENTS

| | | |
|---|---|---|
| 5,905,418 A | 5/1999 | Ehara |
| 6,150,904 A | 11/2000 | Taniguchi et al. |
| 6,747,530 B1 | 6/2004 | Selmeier |
| 2003/0058066 A1 | 3/2003 | Taniguchi et al. |
| 2003/0186673 A1* | 10/2003 | Kimachi et al. ............. 455/339 |
| 2004/0212451 A1* | 10/2004 | Iwamoto et al. ............. 333/133 |
| 2005/0070332 A1 | 3/2005 | Yamato |
| 2006/0139120 A1* | 6/2006 | Yamaguchi et al. ......... 333/133 |

FOREIGN PATENT DOCUMENTS

| | | |
|---|---|---|
| CN | 1394389 A | 1/2003 |
| CN | 1543065 A | 11/2004 |
| JP | 09-098056 A | 4/1997 |
| JP | 10-200370 A | 7/1998 |
| JP | 2004-007250 A | 1/2004 |
| JP | 2004-328676 A | 11/2004 |
| JP | 2005-124139 A | 5/2005 |
| JP | 2005-176321 A | 6/2005 |
| JP | 2005-223572 A | 8/2005 |
| JP | 2005-295203 | 10/2005 |

* cited by examiner

Primary Examiner — Dominic E Rego
(74) Attorney, Agent, or Firm — Arent Fox LLP

(57) ABSTRACT

A duplexer includes a transmit filter of a ladder type filter, connected between a common terminal and a transmitting terminal, and a receive filter of the ladder type filter, connected between the common terminal and a receiving terminal. One or more parallel resonators in the transmit filter are grounded through a transmitting inductance, and a portion of multiple parallel resonators are grounded through a first receiving inductance and a remaining portion of the multiple parallel resonators are grounded through a second receiving inductance.

13 Claims, 23 Drawing Sheets

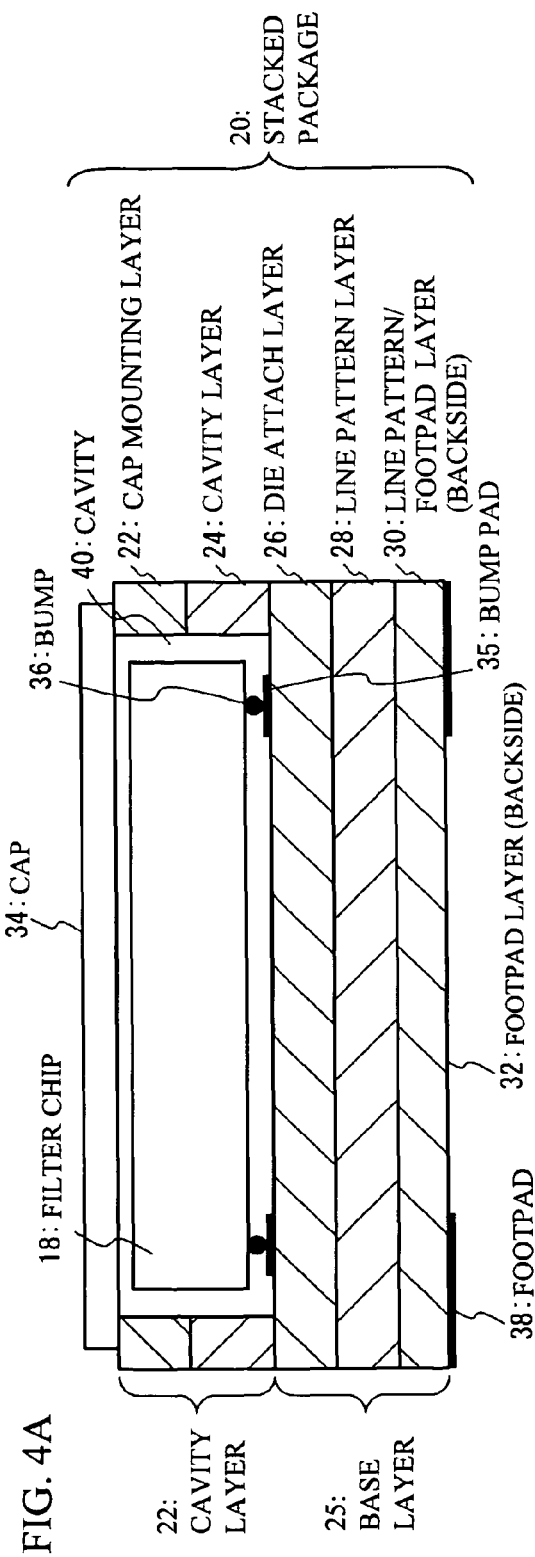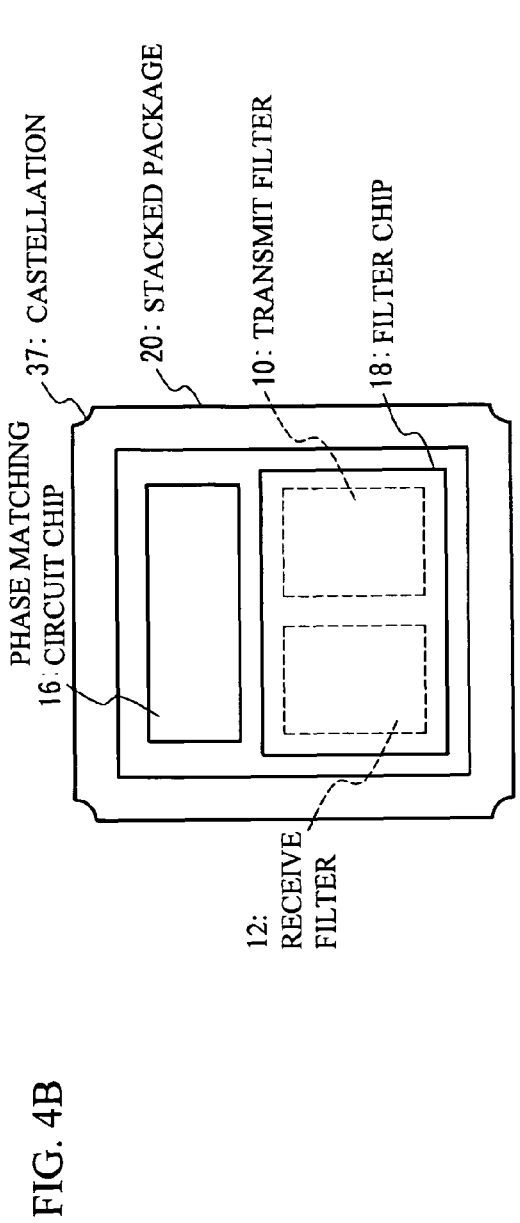

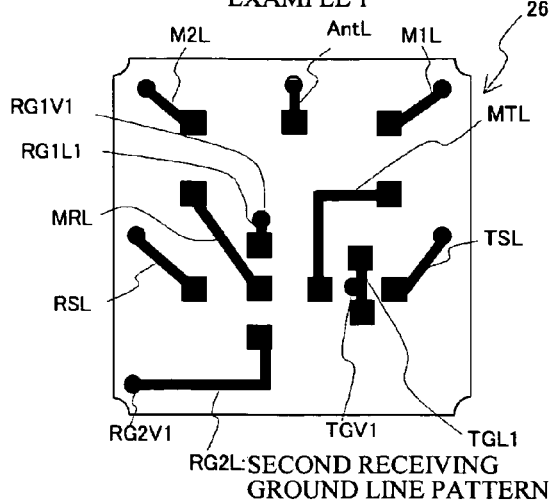# FIG. 8A COMPARATIVE EXAMPLE 1
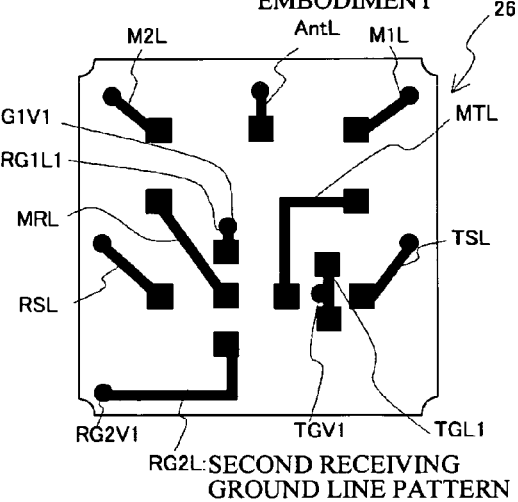# FIG. 8D FIRST EXEMPLARY EMBODIMENT

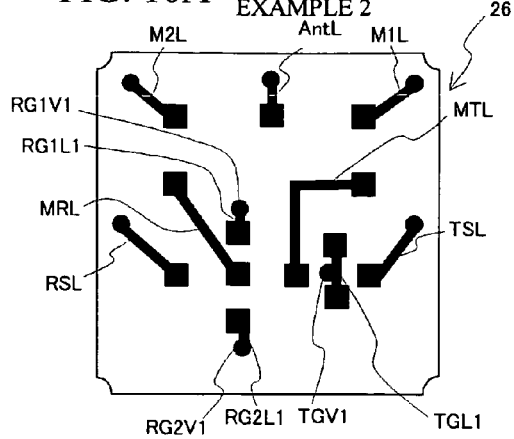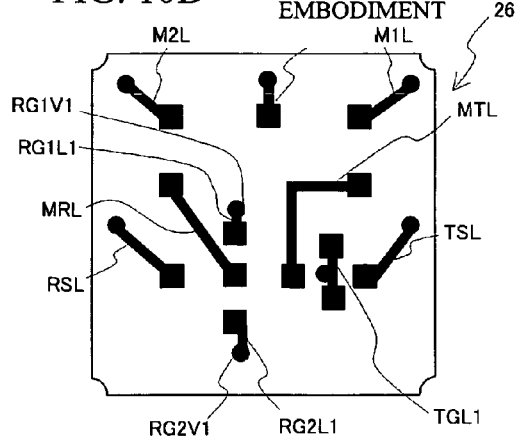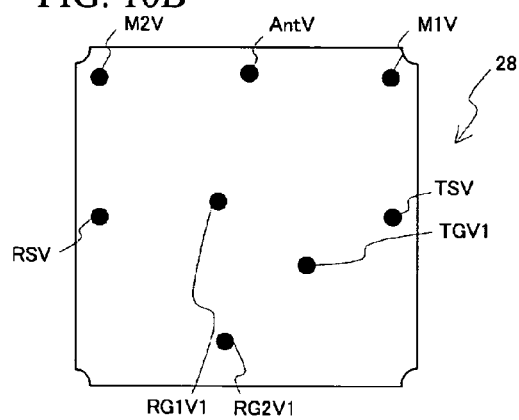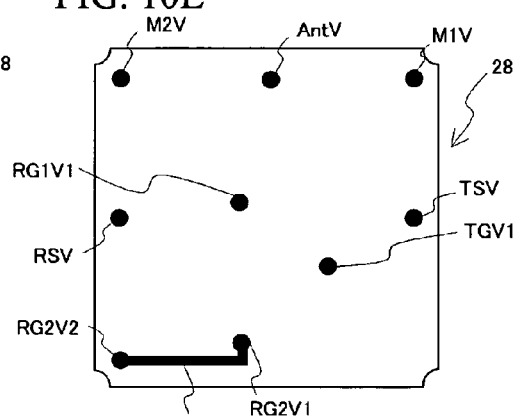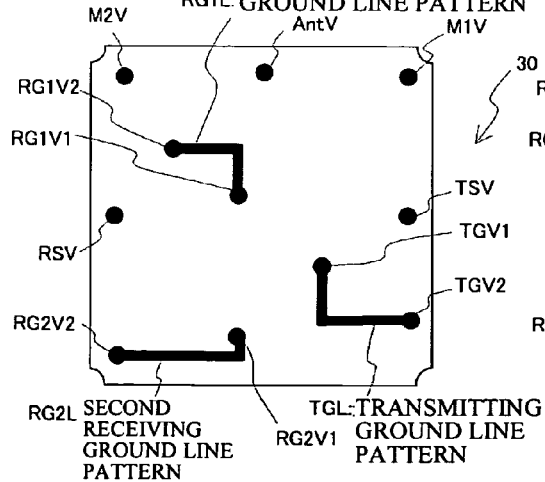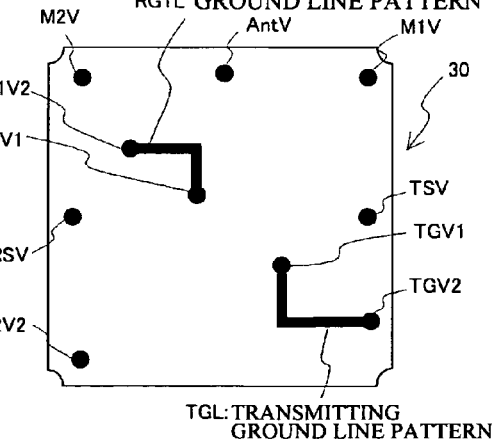

COMPARATIVE EXAMPLE 3

FIRST EXEMPLARY EMBODIMENT

COMPARATIVE EXAMPLE 3

THIRD EXEMPLARY EMBODIMENT

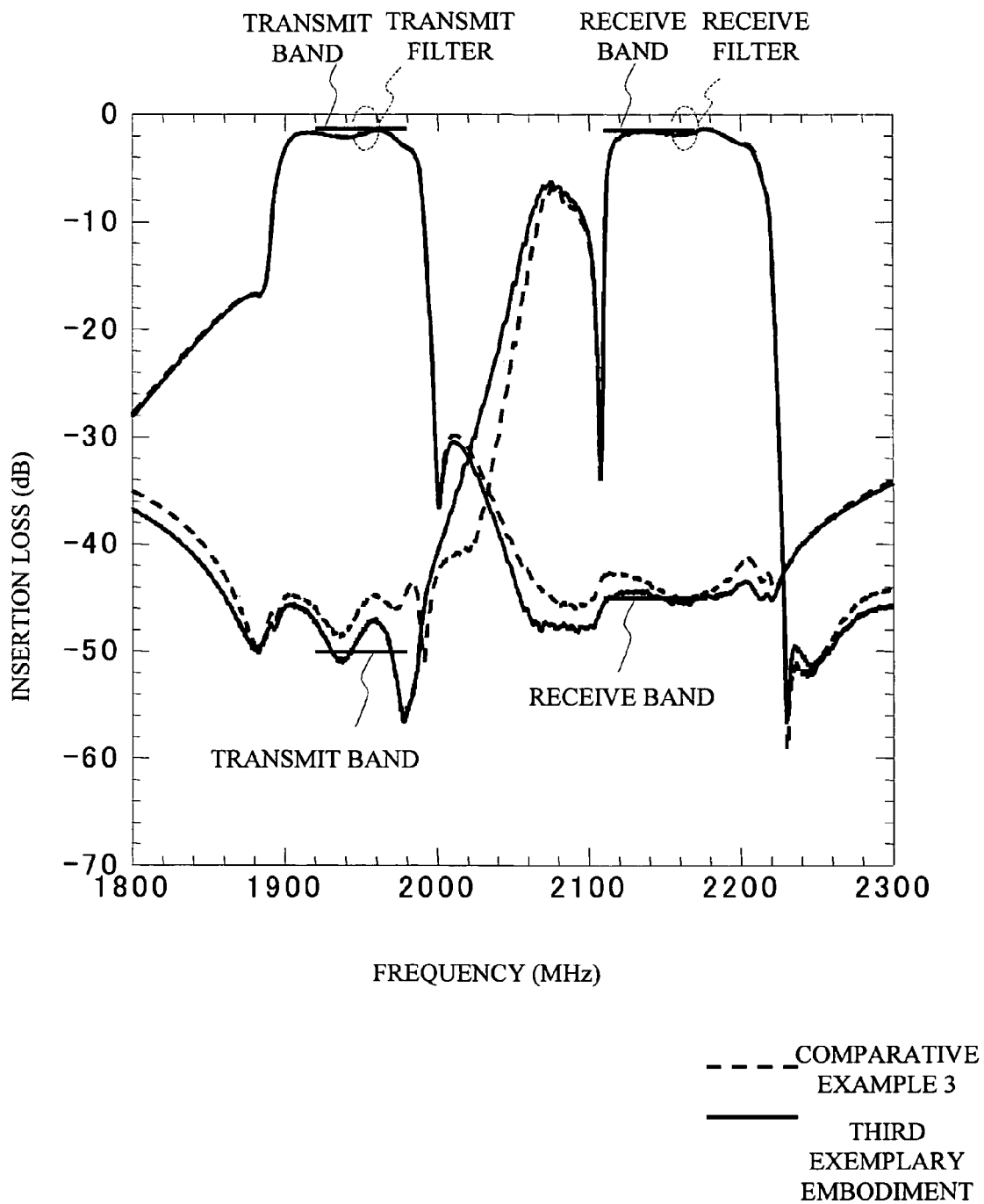

FIRST EXEMPLARY EMBODIMENT

THIRD EXEMPLARY EMBODIMENT

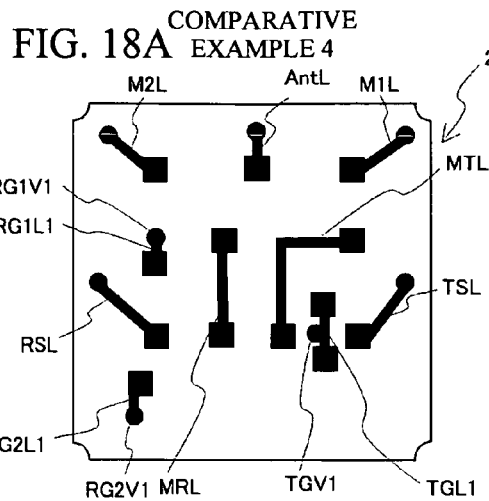
FIG. 18A COMPARATIVE EXAMPLE 4
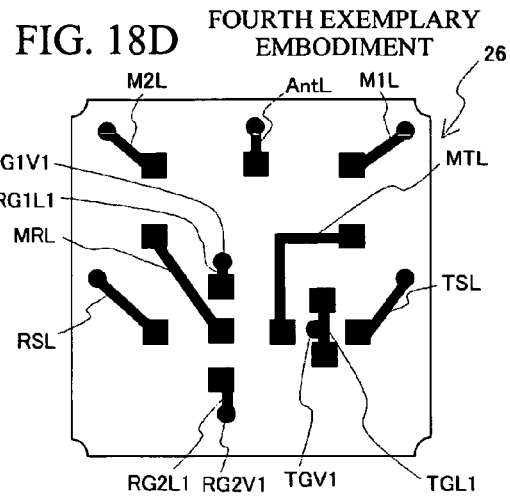
FIG. 18D FOURTH EXEMPLARY EMBODIMENT
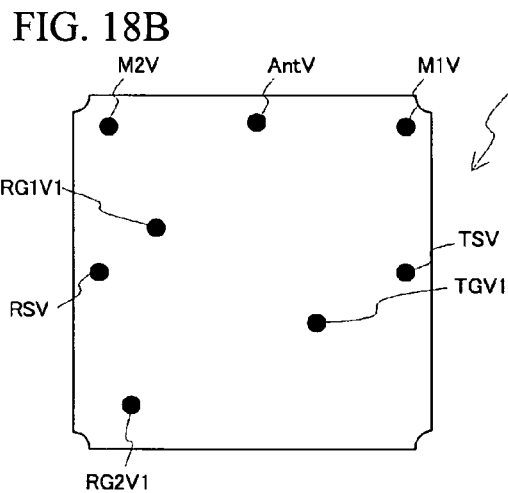
FIG. 18B
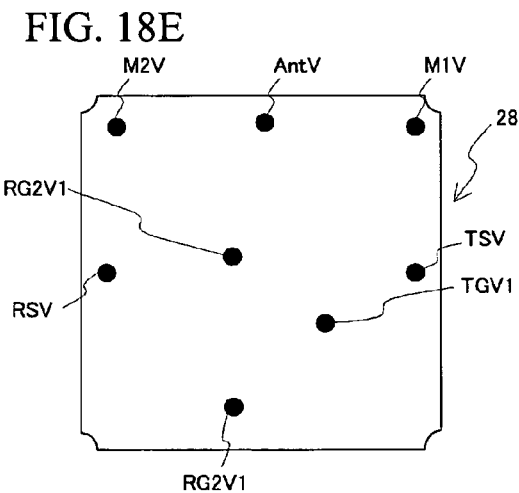
FIG. 18E
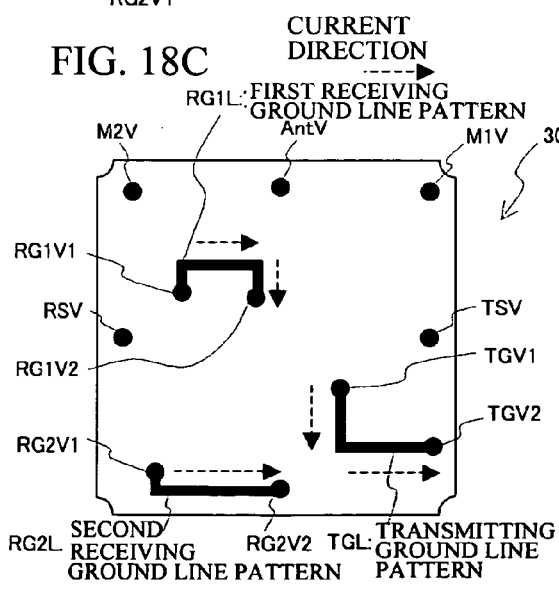
FIG. 18C
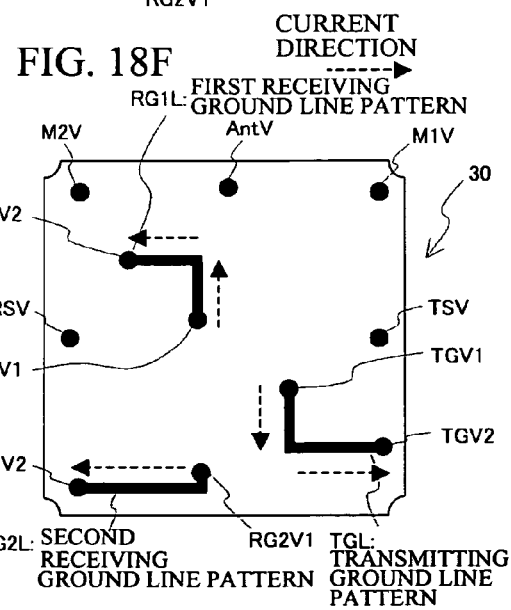
FIG. 18F

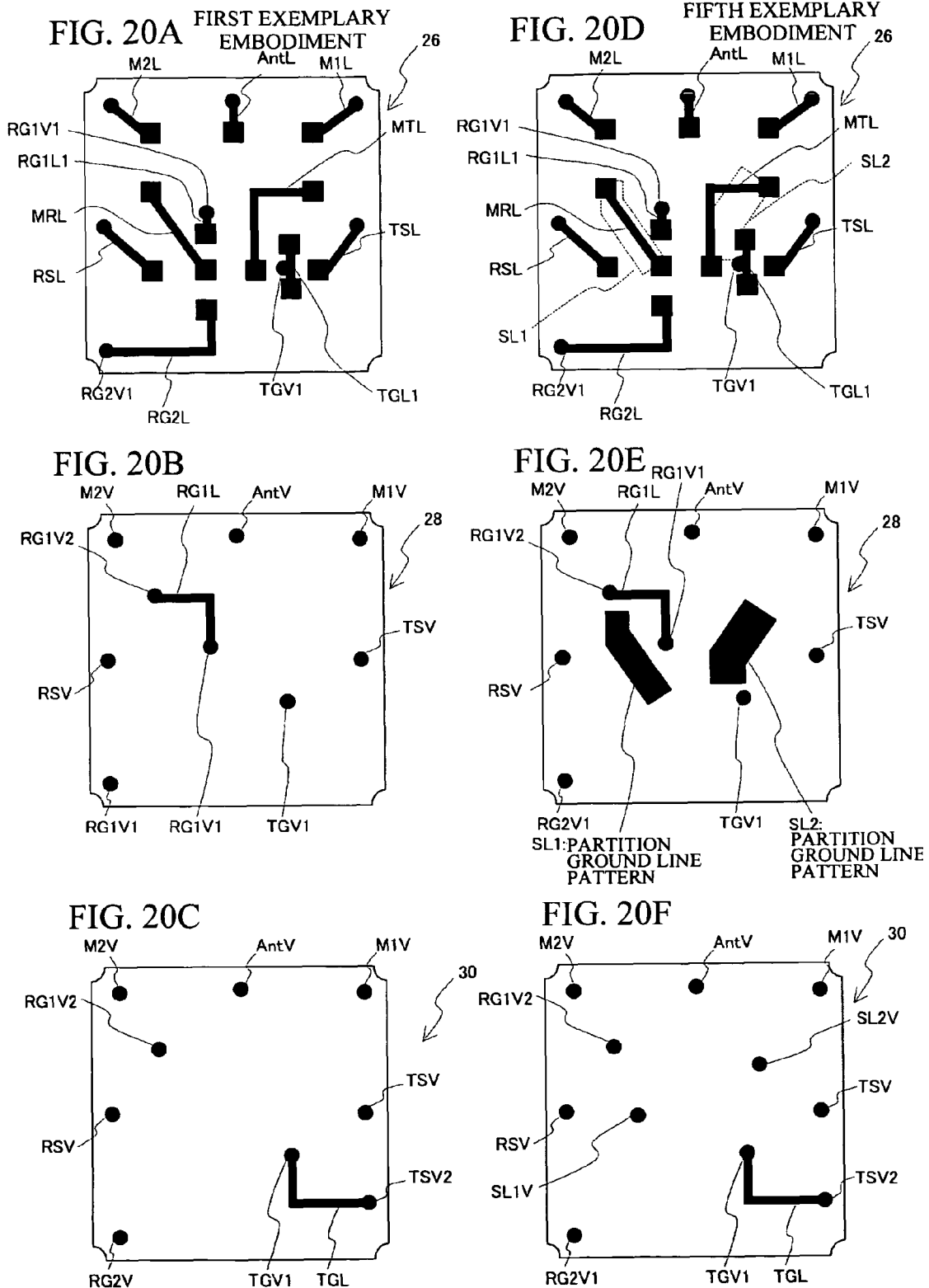

COMPARATIVE EXAMPLE 5

FIRST EXEMPLARY EMBODIMENT

---- COMPARATIVE EXAMPLE 5
—— FIRST EXEMPLARY EMBODIMENT

DUPLEXER

BACKGROUND OF THE INVENTION

1. Field of the Invention

This invention generally relates to duplexers, and more particularly, to a duplexer in which ladder type filters are for use in a transmit filter and a receive filter.

2. Description of the Related Art

In recent years, with the advancement of mobile communications systems, portable information terminals or the like are rapidly wide spreading. Developments have been done to reduce the sizes of the above-described terminals and to improve performance thereof. Both analogue and digital are used for mobile telephone systems, in which 800 MHz to 1 GHz frequency bandwidth and 1.5 GHz to 2.0 GHz frequency bandwidth are mainly used. There have been proposed antenna duplexers that employ a surface acoustic wave filter or piezoelectric thin-film resonator filter so as to be employed in the devices for mobile communications systems.

In the development of the mobile telephones these days, the performance of the terminals is improved by variations of the systems, for example, by utilizing a dual mode or dual band. In the dual mode, the mobile telephones operate on both analogue (Code Division Multiple Access: CDMA) and digital (Time Division Multiple Access: TDMA) networks. In the dual band, 800 MHz bandwidth and 1.9 GHz bandwidth or 900 MHz bandwidth and 1.5 GHz bandwidth are used at the same time. Hence, there is a demand for high-performance parts (filters) for use in the above-described terminals.

Meanwhile, in addition to the improvement of the performance, there are also demands for size reduction and cost reduction. A number of antenna duplexers for use in high-performance terminals are composed of a combined duplexer in which a dielectric material is used for the transmit filter and received filter, a dielectric material is used for at least one of the transmit filter and the receive filter and a surface acoustic wave device is used for the other, or only surface acoustic wave devices are used.

The dielectric duplexer has a large size, making it difficult to reduce the size of the portable terminal device or to reduce the thickness thereof. Even when the surface acoustic wave device is used for one of the transmit filter and the receive filter, the size of the dielectric device makes it difficult to reduce the size of the portable terminal device or to reduce the thickness thereof. The duplexer device having a conventional surface acoustic wave filter used therein has: a module type device in which there are independently provided a transmit filter, a receive filter, and a matching circuit on a printed board; and a monolithic type device in which there are mounted a transmit/receive filter chip on a multilayer ceramic package and a matching circuit provided therein. The volume of the afore-described duplexer device has a volume approximately ⅓ to ¹⁄₁₅ that of a dielectric duplexer. With respect to only the height, the thickness can be reduced by approximately ½ to ⅓.

Next, a commonly used duplexer will be described. FIG. 1 is a block diagram of a duplexer. FIG. 2 shows bandpass intensity with respect to frequency of the duplexer. Referring now to FIG. 1, the duplexer includes: two filters of, for example, a transmit filter 10; a receive filter 12; an impedance matching circuit (hereinafter, simply referred to as matching circuit) 14; a common terminal Ant; and respective terminals, for example, a transmitting terminal Tx and a receiving terminal Rx.

The common terminal Ant is a terminal coupled to an external circuit that sends and receives radio waves through an antenna. The transmitting terminal Tx is a terminal coupled to an external transmitting circuit to input a signal having a desired center frequency. The receiving terminal Rx is a terminal connected to an external receiving circuit to output a signal having a desired center frequency. Another terminal, not shown, other than the transmitting terminal Tx and the receiving terminal Rx is connected to the ground level (GND).

In general, the transmit filter 10, the receive filter 12, and the matching circuit 14 are housed in a multilayer ceramic package. The transmit filter 10 and the receive filter 12 are respectively composed of, for example, a surface acoustic wave filter or piezoelectric thin-film resonator filter, and respectively have different center frequencies F1 and F2. Here, in most cases, F2>F1 is satisfied. For example, in a duplexer for a W-CDMA system operating at 2 GHz, the transmit band ranges 1920 MHz to 1980 MHz and the receive band ranges 2110 MHz to 2170 MHz. The difference between the transmit band and the receive band is 130 MHz.

The matching circuit 14 is provided so that the transmit filter 10 and the receive filter 12 do not degrade each other. Z1 represents a characteristic impedance when the transmit filter 10 is viewed from the common terminal Ant, and Z2 represents a characteristic impedance when the receive filter 12 is viewed therefrom. When F1 is the frequency of the signal fed from the common terminal Ant, the characteristic impedance Z1 at the side of the receive filter 12 corresponds to that of the common terminal Ant, and the characteristic impedance at the side of the receive filter 12 is infinite and the reflection coefficient is 1, by means of the effect of the matching circuit 14. The characteristic impedance Z2 of the receive filter 12 is configured to correspond to that of the common terminal Ant.

As disclosed in Japanese Patent Application Publication No. 2004-328676, there is provided a duplexer in which the transmit filter 10 and the receive filter 12 are mounted in a stacked package and a ground line pattern that forms an inductance is provided on a die attach layer and a lower layer thereof in the stacked package, for the purpose of size reduction of the duplexer.

There is a demand for duplexers to improve the attenuation characteristic in the opposite passband (suppression), in other words, to improve the attenuation characteristic in the transmit band of the receive filter and to improve the attenuation characteristic in the receive band of the transmit filter. In particular, it is difficult to improve the attenuation characteristic of the opposite passband in the duplexer for use in the W-CDMA system operating at 2 GHz.

SUMMARY OF THE INVENTION

The present invention has been made in view of the above circumstances and provides a duplexer that can improve the attenuation characteristics of opposite passbands.

According to one aspect of the present invention, there is provided a duplexer including: a transmit filter of a ladder type filter, connected between a common terminal and a transmitting terminal; and a receive filter of the ladder type filter, connected between the common terminal and a receiving terminal, and one or more parallel resonators in the transmit filter are grounded through a transmitting inductance; and a portion of multiple parallel resonators are grounded through a first receiving inductance and a remaining portion of the multiple parallel resonators are grounded through a second receiving inductance. The attenuation characteristics of opposite passbands can be improved.

BRIEF DESCRIPTION OF THE DRAWINGS

Preferred exemplary embodiments of the present invention will be described in detail with reference to the following drawings, wherein:

FIG. 4A is a schematical cross-sectional view of a stacked package;

FIG. 4B is a top view of the stacked package, from which a cap thereof is removed;

FIG. 8A through FIG. 8C respectively show a die attach layer, a line pattern layer, and a line pattern/footpad layer in the duplexer of a comparative example 1;

FIG. 8D through FIG. 8F respectively show the die attach layer, the line pattern layer, and the line pattern/footpad layer in the duplexer employed in the first exemplary embodiment of the present invention;

FIG. 10A through FIG. 10C respectively show the die attach layer, the line pattern layer, and the line pattern/footpad layer in the duplexer of a comparative example 2;

FIG. 10D through FIG. 10F respectively show the die attach layer, the line pattern layer, and the line pattern/footpad layer in the duplexer employed in a second exemplary embodiment of the present invention;

FIG. 15 shows bandpass characteristics of the transmit filter and the receive filter in the duplexer employed in the third exemplary embodiment and that of the comparative example 3, and also shows the insertion loss in the frequency of the transmit filter and that of the receive filter;

FIG. 18A through FIG. 18C respectively show the die attach layer, the line pattern layer, and the line pattern/footpad layer in the duplexer of a comparative example 4;

FIG. 18D through FIG. 18F respectively show the die attach layer, the line pattern layer, and the line pattern/footpad layer of the duplexer employed in a fourth exemplary embodiment of the present invention;

FIG. 20A through FIG. 20C respectively show the die attach layer, the line pattern layer, and the line pattern/footpad layer of the duplexer employed in the first exemplary embodiment;

FIG. 20D through FIG. 20F respectively show the die attach layer, the line pattern layer, and the line pattern/footpad layer in the duplexer employed in a fifth exemplary embodiment of the present invention;

DESCRIPTION OF THE PREFERRED EMBODIMENTS

A description will now be given, with reference to the accompanying drawings, of exemplary embodiments of the present invention.

First Exemplary Embodiment

Figure 1:
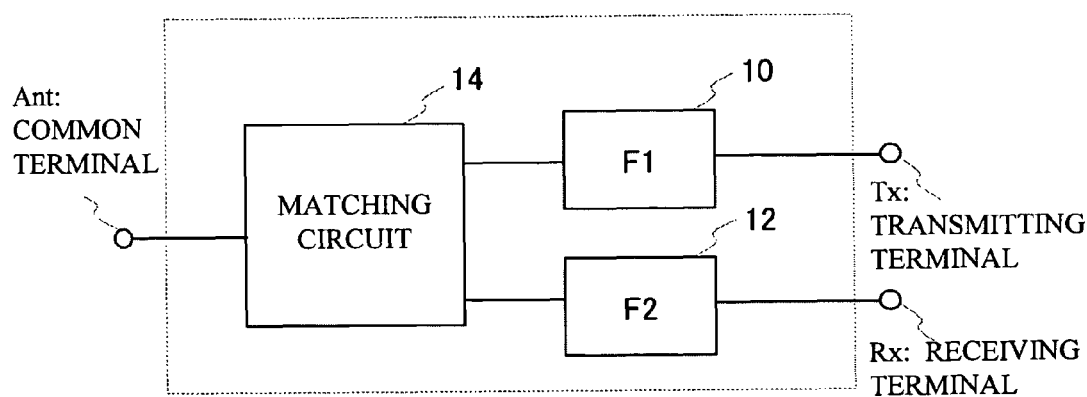
FIG. 1 is a block diagram of a conventional duplexer.
Figure 2:
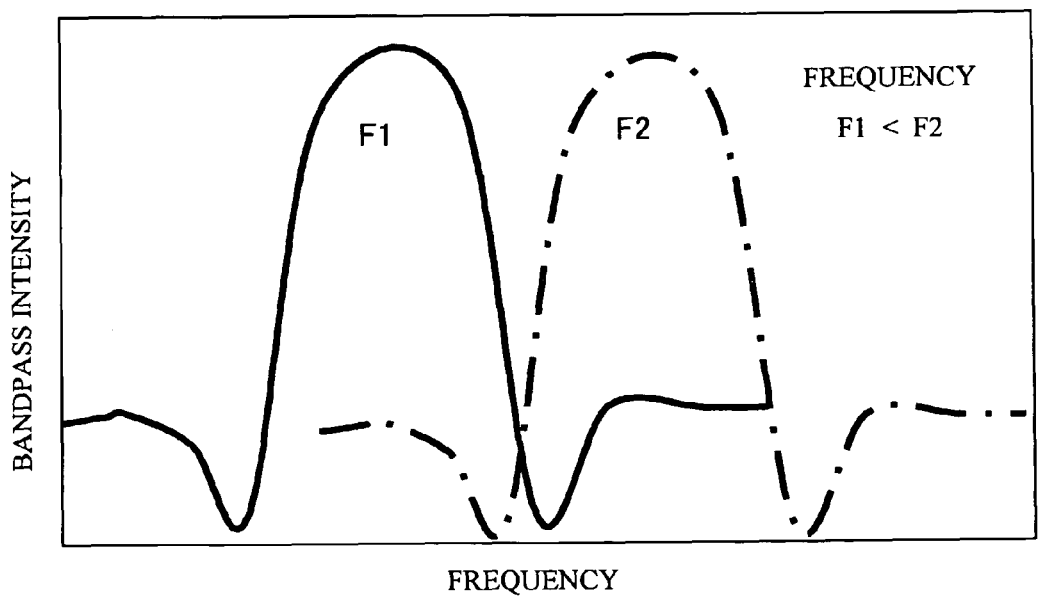
FIG. 2 shows bandpass intensity with respect to frequency of the duplexer.
Figure 3:
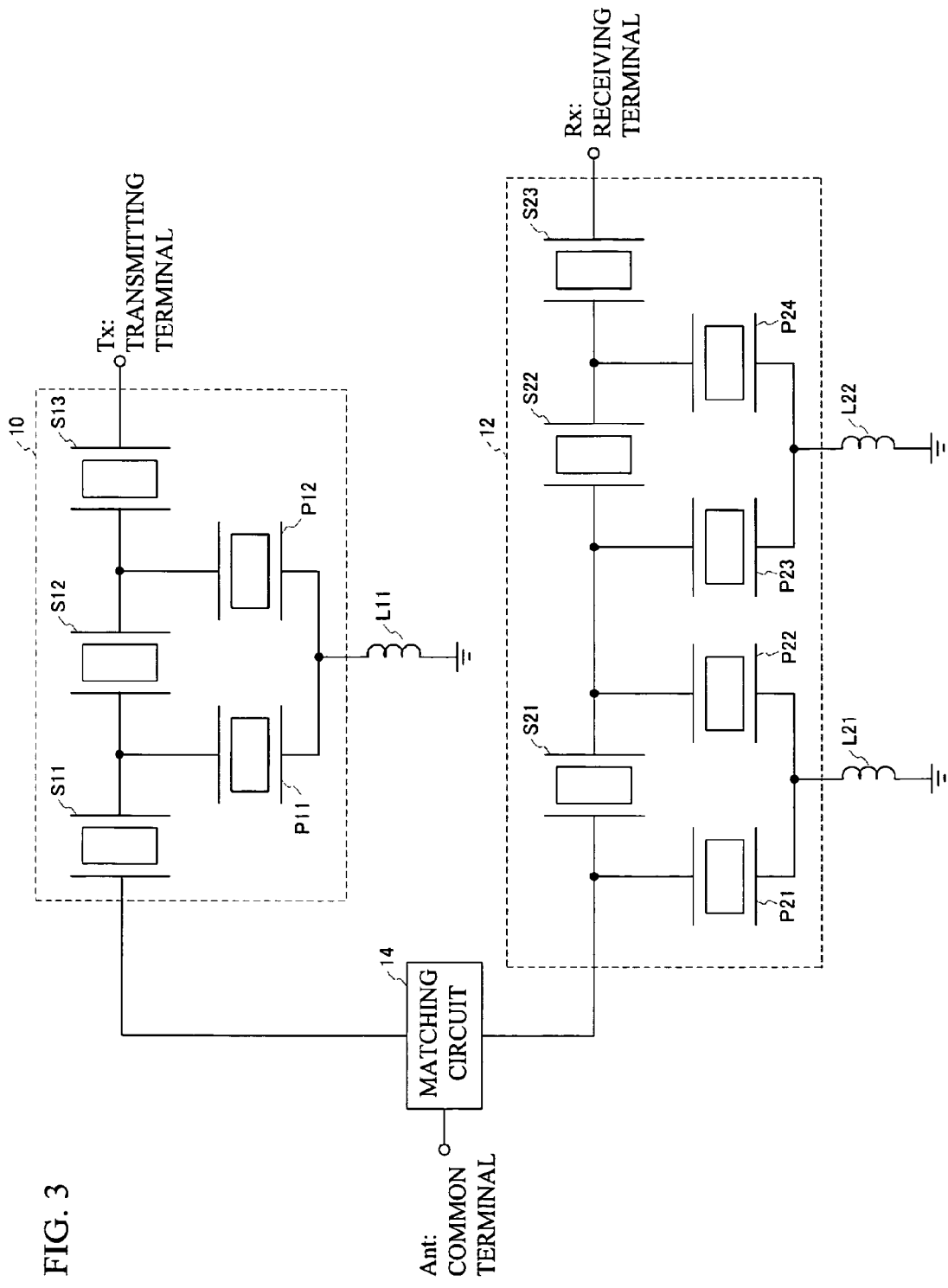
FIG. 3 is a circuit diagram of the duplexer employed in a first exemplary embodiment of the present invention.

A first exemplary embodiment of the present invention is an example in which a duplexer having ladder type filters for use in a W-CDMA system operating at 2 GHz is mounted on a stacked package. FIG. 3 is a circuit diagram of the duplexer employed in the first exemplary embodiment of the present invention. There are provided: the transmit filter 10 of a ladder type filter connected between the common terminal Ant and the transmitting terminal Tx; and the receive filter 12 of the ladder type filter connected between the common terminal Ant and the receiving terminal Rx. The matching circuit 14 is connected between the common terminal Ant and the transmit filter 10 and the receive filter 12.

The transmit filter 10 is a ladder type filer having series resonators S11 through S13 and parallel resonators P11 and P12. All the parallel resonators P11 and P12 in the transmit filter 10 are connected together at the sides of the ground terminals, and are grounded through a transmitting inductance L11. Meanwhile, a portion of the multiple parallel resonators P21 through P24 in the receive filter 12, namely, the resonators P21 and P22 are connected together at the sides of the ground terminals, and are grounded through a first receiving inductance L21. The remaining portion of the multiple parallel resonators P21 through P24 in the receive filter 12, namely, the resonators P23 and P24 are connected together at the sides of the ground terminals, and are grounded through a second receiving inductance L22.

In the first exemplary embodiment, the parallel resonators are connected together in the transmit filter 10, and are grounded through the transmitting inductance L11, whereas the parallel resonators in the receive filter 12 are divided into two portions and such divided parallel resonators are respectively connected together and grounded through the inductances. This can improve attenuation characteristics of the opposite passbands of the filters included in the duplexer. In the receive filter 12, the parallel resonators may be divided into three resonators and one resonator and grounded. In the duplexer for the W-CDMA system operating at, for example, 2 GHz, in which the transmit band and the receive band are separate, however, it is preferable that the parallel resonators be divided into two resonators and two resonators and respectively be grounded in the receive filter 12. The attenuation in the opposite passband is determined by a multiplication of an inductance L and a capacitance C. That is to say, the attenuation in the opposite passband is determined by a multiplication of the capacitance of the chip and the inductance of the package. A large inductance of approximately 3 nH is needed for the duplexer for the W-CDMA system operating at, for example, 2 GHz, in which the transmit band and the receive band are separate. For this reason, if the parallel resonators are divided into three resonators and one resonator in the receive filter 12 and grounded, an extremely large inductance is needed for the inductance of the package, the inductance being connected to the above-described one resonator. The line pattern in the package to form such an extremely large inductance makes a mutual inductance with another line pattern larger. This will degrade the attenuation characteristics. Therefore, it is preferable that the parallel resonators be divided into two resonators and two resonators and respectively be grounded in the receive filter 12.

In the first exemplary embodiment, there are provided two parallel resonators in the transmit filter 10. However, there may be provided three or more parallel resonators. If there are provided three or more parallel resonators, either the parallel resonator P11 or the parallel resonator P12 is divided into two parallel resonators, the parallel resonators are connected together at the sides of the ground terminals, and such connected parallel resonators are grounded through the transmitting inductance L11. Meanwhile, if there is provided one parallel resonator in the transmit filter 10, the transmit filter 10 becomes a two-stage filter, making it difficult to retain the attenuation characteristics.

A description will now be given of a stacked package in which the duplexer employed in the first exemplary embodiment of the present invention is mounted. FIG. 4A is a schematic cross-sectional view of a stacked package 20. FIG. 4B is a top view of the stacked package 20, from which a cap thereof is removed. Referring to FIG. 4A, the stacked package 20 is composed of stacked layers. The stacked layers include: a cap mounting layer 22; a cavity layer 24; a die attach layer 26; a line pattern layer 28; and a line pattern/footpad layer 30. The cap mounting layer 22 and the cavity layer 24 compose a cavity layer 23 to form a cavity 40 in which a filter chip 18 is housed. A cap 34 is provided on the cap mounting layer 22 to seal the filter chip 18 in the cavity 40. The die attach layer 26, the line pattern layer 28, and the line pattern/footpad layer 30 compose a base layer 25. Bump pads 35 are provided on the surface of the die attach layer 26, and the filter chip 18 is mounted on the bump pads 35 through bumps 36. Footpads 38 are formed on a footpad layer 32, which is the lower layer of the line pattern/footpad layer 30. Each of the stacked layers is formed of an insulator such as ceramic or the like, and conductive patterns such as line patterns or vias, described later, are formed therein. As an insulator, for example, alumina or glass ceramic of, for example, approximately 9.5 of relative dielectric constant may be employed.

Referring to FIG. 4B, the filter chip 18 having the transmit filter 10 and the receive filter 12 therein and a phase matching circuit chip 16 are face-down mounted on the die attach layer 26 in the stacked package 20. Castellations 37 are arranged at the four corners of the stacked package 20 so as to couple the cap or the like to the footpads for grounding 38 provided on the footpad layer 32. Here, the external dimension of the stacked package 20 may be, for example, 3×3×0.9 mm. For example, a lumped parameter circuit may be employed for the matching circuit 14. A piezoelectric thin film resonator filter in which AlN is used for a piezoelectric film may be used for the transmit filter 10 and the receive filter 12 formed in the filter chip 18.

Figure 5A:
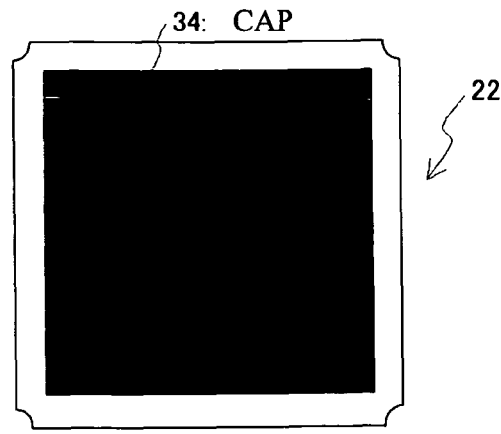
FIG. 5A through FIG. 5C respectively show a cap mounting layer, a cavity layer, and a die attach layer of the duplexer employed in the first exemplary embodiment of the present invention.
Figure 5B:
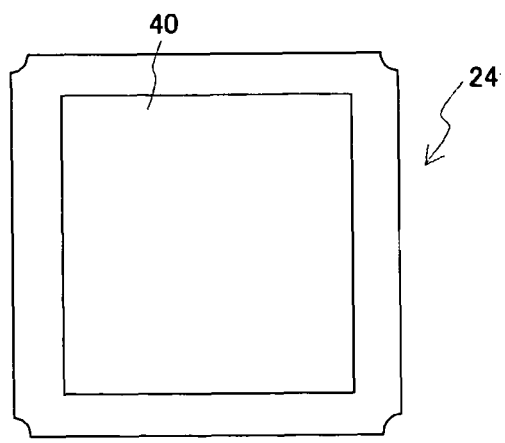

The configuration of the layers in the stacked package 20 will be described with reference to FIG. 5A through FIG. 7B. In the drawings, the patterns in black represent conductive patterns. Referring now to FIG. 5A, an air hole is defined in the cap mounting layer 22 to form the cavity 40, and the cap 34 is placed on the air hole. Referring now to FIG. 5B, the air hole is also defined in the cavity layer 24 to form the cavity 40.

Figure 5C:
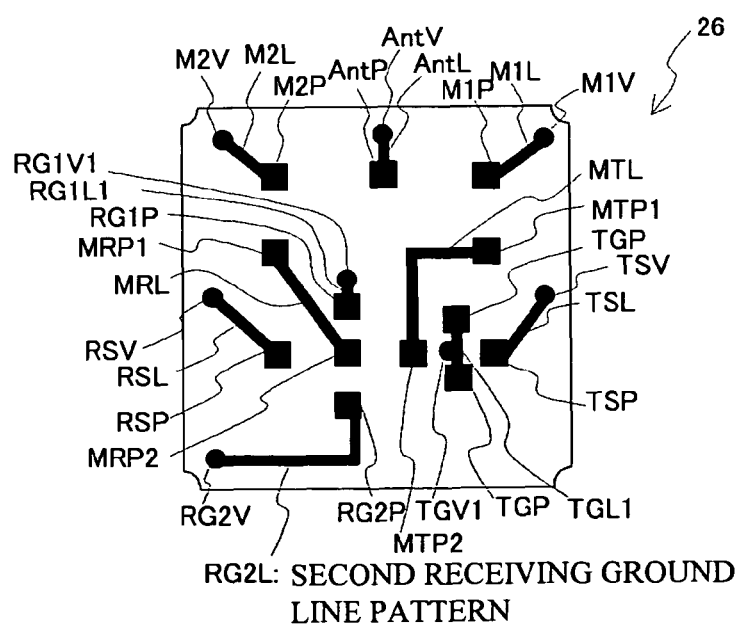

Referring now to FIG. 5C, there are provided on the surface of the die attach layer 26: bump pads formed of a conductive material such as a metal; and conductive patterns such as vias in which a conductor is embedded and line patterns. As shown in FIG. 4A and FIG. 4B, the bump pads 35 are provided to face-down mount the filter chip 18 and the phase matching circuit chip 16. The pads of the chips and the bump pads 35 are electrically coupled by the bumps 36. The vias extend through each of the stacked layers and a conductor such as a metal is embedded in the vias. The line pattern is a conductive pattern to couple the bump pads or the vias. The ground line pattern couples the bump pads and ground. The signal line pattern couples the bump pads and the common terminal, the transmitting terminal, or the receiving terminal.

FIG. 5C does not show the filter chip 18 or the phase matching circuit chip 16. A common terminal pad of the phase matching circuit chip 16 is coupled to a bump pad AntP, and is coupled through a line pattern for the common terminal AntL to a via AntV. The via AntV is coupled through the vias AntV formed in the line pattern layers 28 and 30 to a common terminal AntT of the footpad layer 32. A ground pad of the phase matching circuit chip 16 is coupled to bump pads M1P and M2P, and is coupled through ground line patterns for the phase matching circuit M1L and M2L to vias M1V and M2V. The vias M1V and M2V are coupled through the vias M1V and M2V in the line pattern layers 28 and 30 to ground footpads GndFP1 and GndFP2 of the footpad layer 32.

A bump pad MTP1 and a bump pad MTP2 are coupled by a connection line pattern (common signal line pattern) MTL that connects the transmit filter 10 and the matching circuit 14, the bump pad MTP1 being coupled to an input pad from the transmit filter 10 in the phase matching circuit chip 16, the bump pad MTP2 being coupled to an output pad of the transmit filter 10. A bump pad MRP1 and a bump pad MRP2 are coupled by a connection line pattern (common signal line pattern) MRL that connects the receive filter 12 and the matching circuit 14, the bump pad MRP1 being coupled to an output pad to output to the receive filter 12 in the phase matching circuit chip 16, the bump pad MRP2 being coupled to an input pad of the receive filter 12.

A bump pad TSP coupled to an input pad of the transmit filter 10 is coupled through a transmitting signal line pattern TSL to a via TSV. The via TSV is coupled through the vias TSV of the line pattern layers 28 and 30 to a transmitting terminal TxT of the footpad layer 32. A bump pad TGP coupled to a pad at the ground sides of the parallel resonators P11 and P12 of the transmit filter 10 is coupled through a ground line pattern TGL1 to a via TGV1.

A bump pad RSP coupled to an output pad of the receive filter 12 is coupled through a receiving signal line pattern RSL to a via RSV. The via RSV is coupled through the vias RSV of the line pattern layers 28 and 30 to a receiving terminal RxT of the footpad layer 32. A bump pad RG1P coupled to a pad at the ground sides of the parallel resonators P21 and P22 of the receive filter 12 is coupled through a line pattern RG1L1 to a via RG1V1. A bump pad RG2P coupled to a pad at the ground sides of the parallel resonators P23 and P24 of the receive filter 12 is coupled through a second receiving ground line pattern RG2L to a via RG2V. The via RG2V is coupled through the vias RG2V of the line pattern layers 28 and 30 to a ground footpad GndFP2 of the footpad layer 32. The second receiving ground line pattern RG2L mainly composes the second receiving inductance L22 shown in FIG. 3.

Figure 6A:
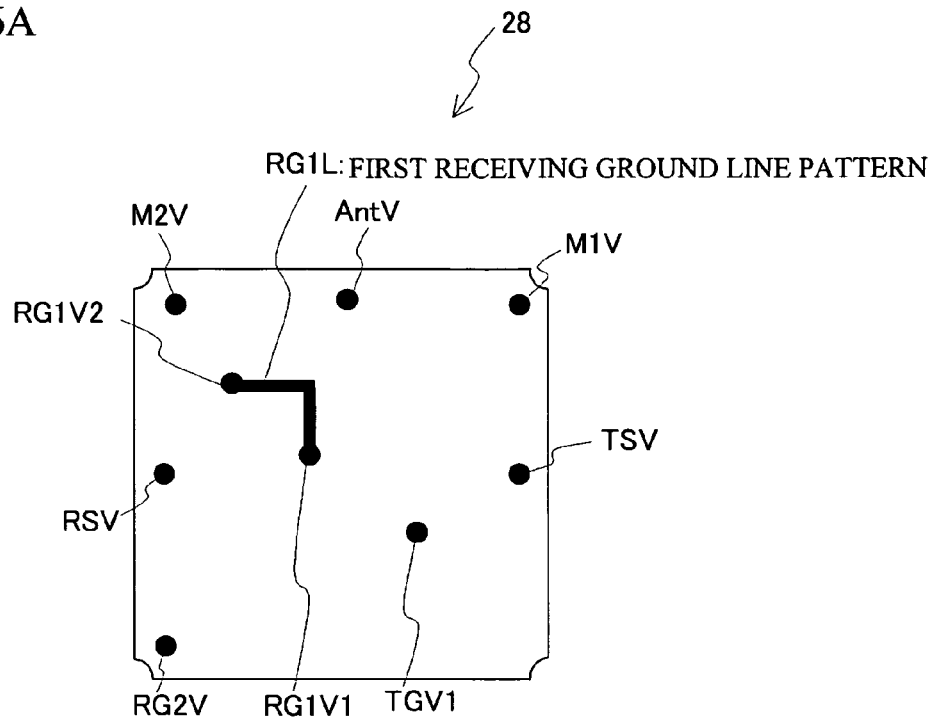
FIG. 6A and FIG. 6B respectively show a line pattern layer and a line pattern/footpad layer of the duplexer employed in the first exemplary embodiment of the present invention.

Referring now to FIG. 6A, there is provided on the surface of the line pattern layer 28, a first receiving ground line pattern RG1L coupled to the via RG1V1 formed on the die attach layer 26 and a via RG1V2 formed on the line pattern layer 28. The first receiving ground line pattern RG1L mainly composes the first receiving inductance L21 shown in FIG. 3. There are provided on the line pattern layer 28: the vias AntV; M1V; M2V; TSV; TGV1; RSV; and RG2V, so as to respectively couple the vias on the die attach layer 26 and those on the line pattern/footpad layer 30.

Figure 6B:
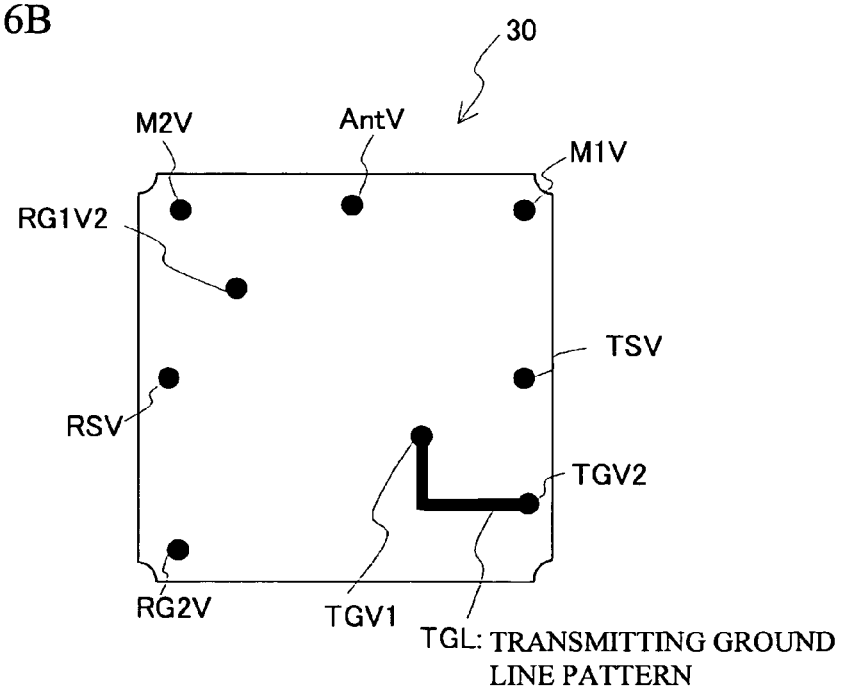

Referring now to FIG. 6B, there is provided on the surface of the line pattern/footpad layer 30, a transmitting ground line pattern TGL that couples the via TGV1 formed on the line pattern layer 28 and the via TGV2 formed on the line pattern/footpad layer 30. The transmitting ground line pattern TGL mainly composes the transmitting ground inductance L11 shown in FIG. 3. There are provided on the line pattern/footpad layer 30: the vias AntV; M1V; M2V; TSV; RG1V2; RSV; and RG2V, so as to respectively couple the vias on the line pattern layer 28 and those on the footpad layer 32.

Figure 7A:
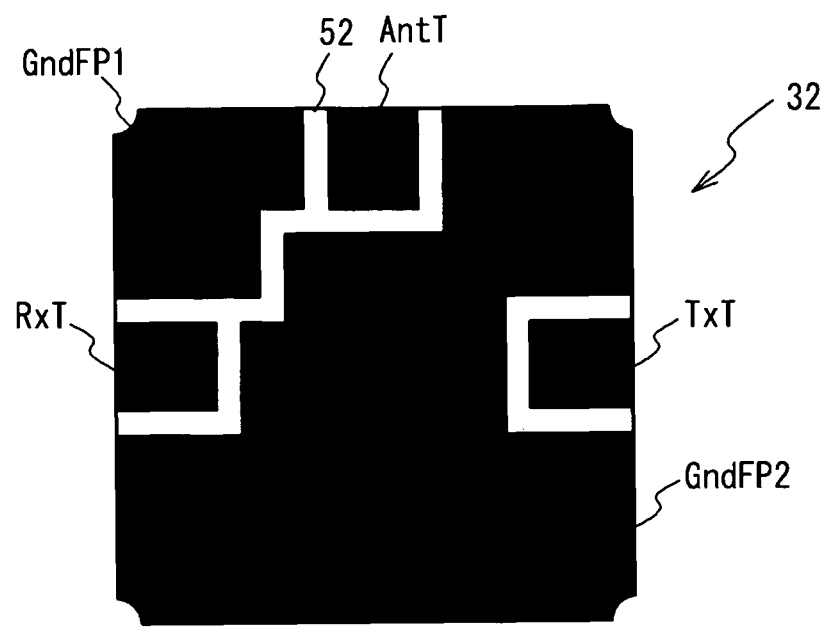
FIG. 7A is the footpad layer in which a ceramic coat is not shown.

Referring now to FIG. 7A, there are provided footpads formed of a metal on the footpad layer 32, which is the backside of the line pattern/footpad layer 30. FIG. 7A does not show a ceramic coat 50 to be described with reference to FIG. 7B. The via AntV is coupled to the common terminal AntT that is a footpad, and is thereby coupled to the common terminal pad of the phase matching circuit chip 16. The transmitting terminal TxT is connected to the via TSV, and is further coupled to an output pad of the transmit filter 10. The receiving terminal RxT is coupled to the via RSV, and is thereby coupled to an input pad of the receive filter 12.

A ground footpad GndFP1 is coupled by the vias M2V and RG1V2, and is thereby coupled to the ground pad of the phase matching circuit chip 16. The ground footpad GndFP1 is also coupled through the first receiving ground line pattern RG1L to pads on the ground sides of the parallel resonators P21 and P22 of the receive filter 12. A ground footpad GndFP2 is coupled by the vias M1V, TGV2, and RG2V, and is thereby coupled to the ground pad of the phase matching circuit chip 16. The ground footpad GndFP2 is also coupled through the transmitting ground line pattern TGL to pads on the ground sides of the parallel resonators P11 and P12 of the transmit filter 10. The ground footpad GndFP2 is also coupled through the second receiving ground line pattern RG2L to pads on the ground sides of the parallel resonators P23 and P24 of the receive filter 12. As described, the ground footpad is provided for coupling the ground of the transmit filter and that of the receive filter to the outside. No metal pattern is provided in regions 52 between the footpads, and the regions 52 are electrically separated and isolated by ceramic.

Figure 7B:
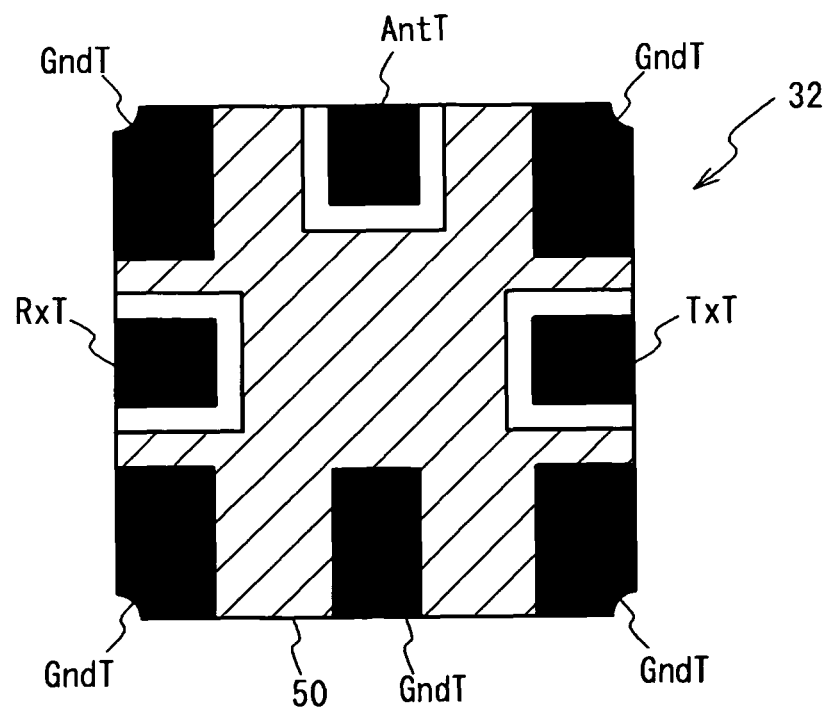
FIG. 7B is the footpad layer in which the ceramic coat is shown.

Referring now to FIG. 7B, the footpad layer 32 is covered with the ceramic coat 50. The ground footpad GndFP2 is changed into a ground terminal GndT by the ceramic coat 50. In this manner, the common terminal AntT coupled to an external circuit or the like; the transmitting terminal Txt; the receiving terminal RxT; the ground terminal GndT; the phase matching circuit chip 16; and the filter chip 18 are coupled.

In the duplexer employed in the first exemplary embodiment of the present invention, there is provided the stacked package 20 that includes multiple stacked layers in which the transmit filter 10 and the receive filter 12 are mounted. There are provided: the transmitting ground line pattern TGL provided on the line pattern/footpad layer 30, which is one of the stacked layer of the stacked package 20, to partially compose the transmitting inductance L11; the first receiving line pattern RG1L provided on the line pattern layer 28, which is one of the stacked layer of the stacked package 20, to partially compose the first receiving inductance L21; and the second receiving ground line pattern RG2L provided on the die attach layer 26, which is one of the stacked layer of the stacked package 20, to partially compose the second receiving inductance L22. The line patterns provided in the stacked layers are respectively referred to as the inductances L11, L21, and L22, enabling the inductance to be reduced in size and also enabling the package to be reduced in size.

Figure 8B:
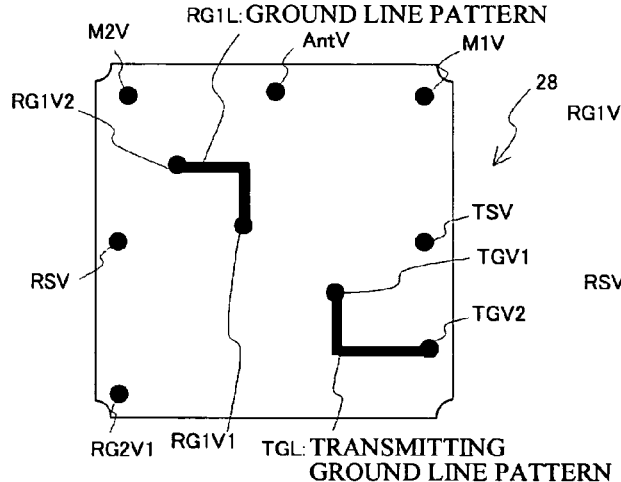
Figure 8E:
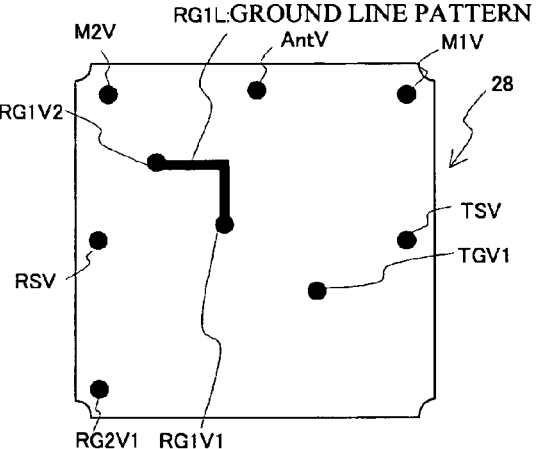
Figure 8C:
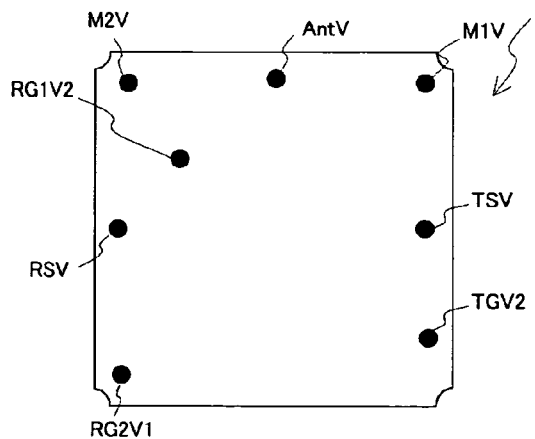
Figure 8F:
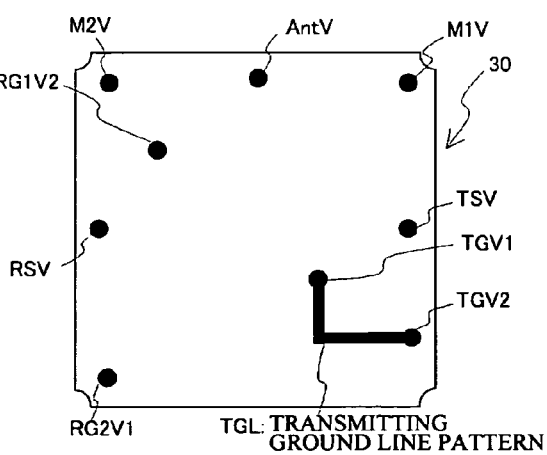

In the duplexer employed in the first exemplary embodiment, the transmitting ground line pattern TGL is provided in a different layer from the receiving ground line pattern RG1L or RG2L. In order to investigate this effect, a duplexer of a comparative example 1 is produced. FIG. 8A through FIG. 8C respectively show the die attach layer 26, the line pattern layer 28, and the line pattern/footpad layer 30 in the duplexer of the comparative example 1. FIG. 8D through FIG. 8F respectively show the die attach layer 26, the line pattern layer 28, and the line pattern/footpad layer 30 in the duplexer employed in the first exemplary embodiment. In the duplexer employed in the first exemplary embodiment, the second receiving ground line pattern RG2L is provided on the die attach layer 26, the first receiving ground line pattern RG1L is provided on the line pattern layer 28, and the transmitting ground line pattern TGL is provided on the line pattern/footpad layer 30. That is to say, the second receiving ground line pattern RG2L, the first receiving ground line pattern RG1L, and the transmitting ground line pattern TGL are provided on different layers. Meanwhile, in the duplexer of the comparative example 1, the first receiving ground line pattern RG1L and the transmitting ground line pattern TGL are provided on the same line pattern layer 28. In the comparative example 1, the same components and configurations as those employed in the first exemplary embodiment have the same reference numerals and a detailed explanation will be omitted.

Figure 9:
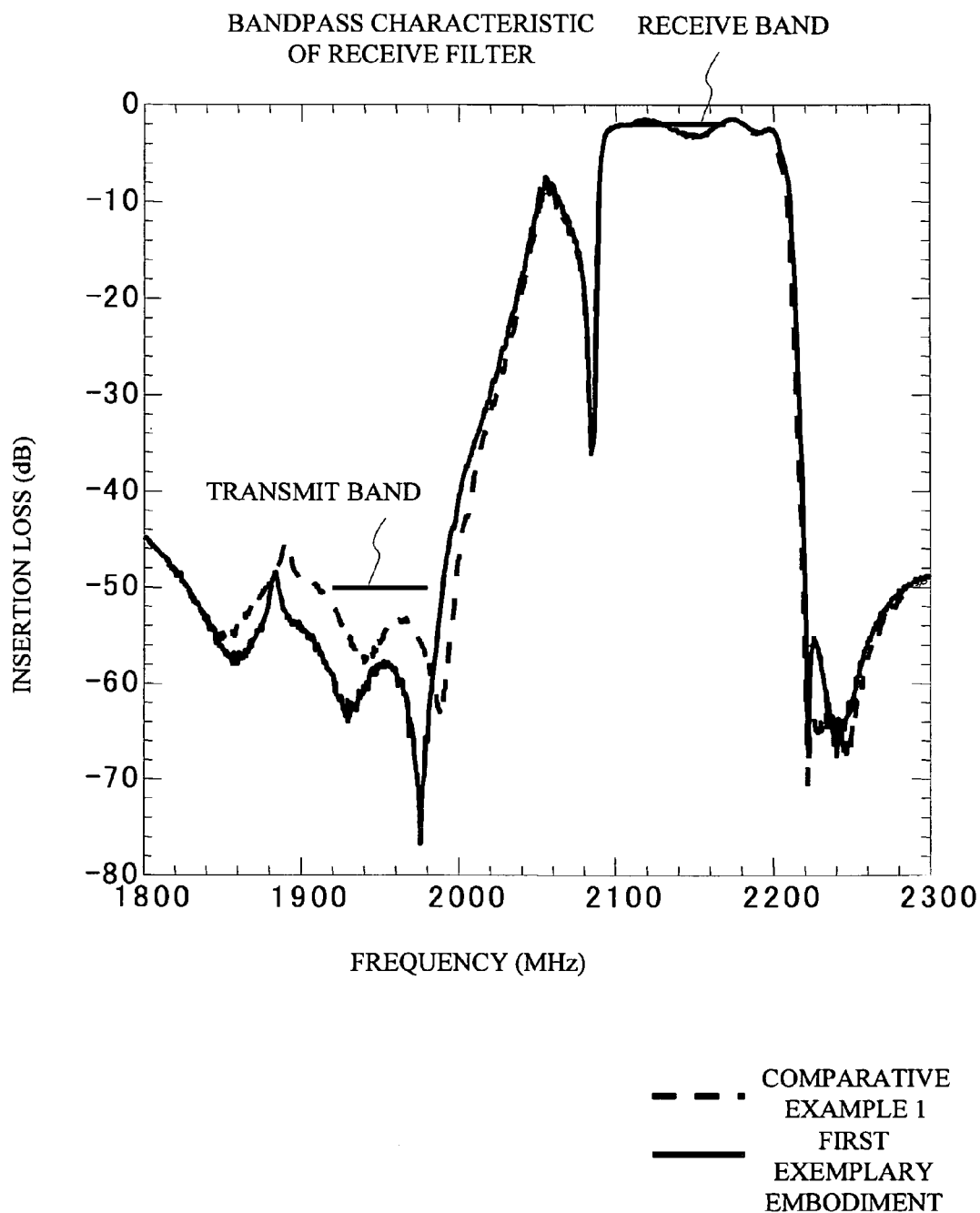
FIG. 9 shows bandpass characteristics of the duplexer employed in the first exemplary embodiment and that of the comparative example 1, and also shows insertion loss in the frequency of a receive filter.

FIG. 9 shows bandpass characteristics of the duplexer employed in the first exemplary embodiment and that of the comparative example 1, and also shows insertion loss in the frequency of the receive filter 12. The attenuation characteristics of the duplexer employed in the first exemplary embodiment is more improved in the transmit band of the receive filter 12 than that of the comparative example 1. That is to say, the filter characteristic of high suppression is obtained. This is because the mutual inductance between the transmitting inductance L11 and the first receiving inductance L21 can be suppressed. As described, the transmitting ground line pattern TGL is provided on a different layer from at least one of the first receiving ground line pattern RG1L and the second receiving ground line pattern RG2L. This makes it possible to suppress the mutual inductance between the transmitting inductance L11 and the receiving inductance L21 or L22, enabling the attenuation characteristic of the duplexer to be improved.

Second Exemplary Embodiment

FIG. 10A through FIG. 10C respectively show the die attach layer 26, the line pattern layer 28, and the line pattern/footpad layer 30 in the duplexer of a comparative example 2. FIG. 10D through FIG. 10F respectively show the die attach layer 26, the line pattern layer 28, and the line pattern/footpad layer 30 in the duplexer employed in a second exemplary embodiment of the present invention. In the duplexer of the comparative example 2, the second receiving ground line pattern RG2L, the first receiving ground line pattern RG1L, and the transmitting ground line pattern TGL are provided on the same line pattern/footpad layer 30. Meanwhile, in the duplexer employed in the second exemplary embodiment, the second receiving ground line pattern RG2L is provided on the line pattern layer 28. In other words, the second receiving ground line pattern RG2L is provided on a different layer from the first receiving ground line pattern RG1L. In the second exemplary embodiment and the comparative example 2, the same components and configurations as those employed in the first exemplary embodiment have the same reference numerals and a detailed explanation will be omitted.

Figure 11:
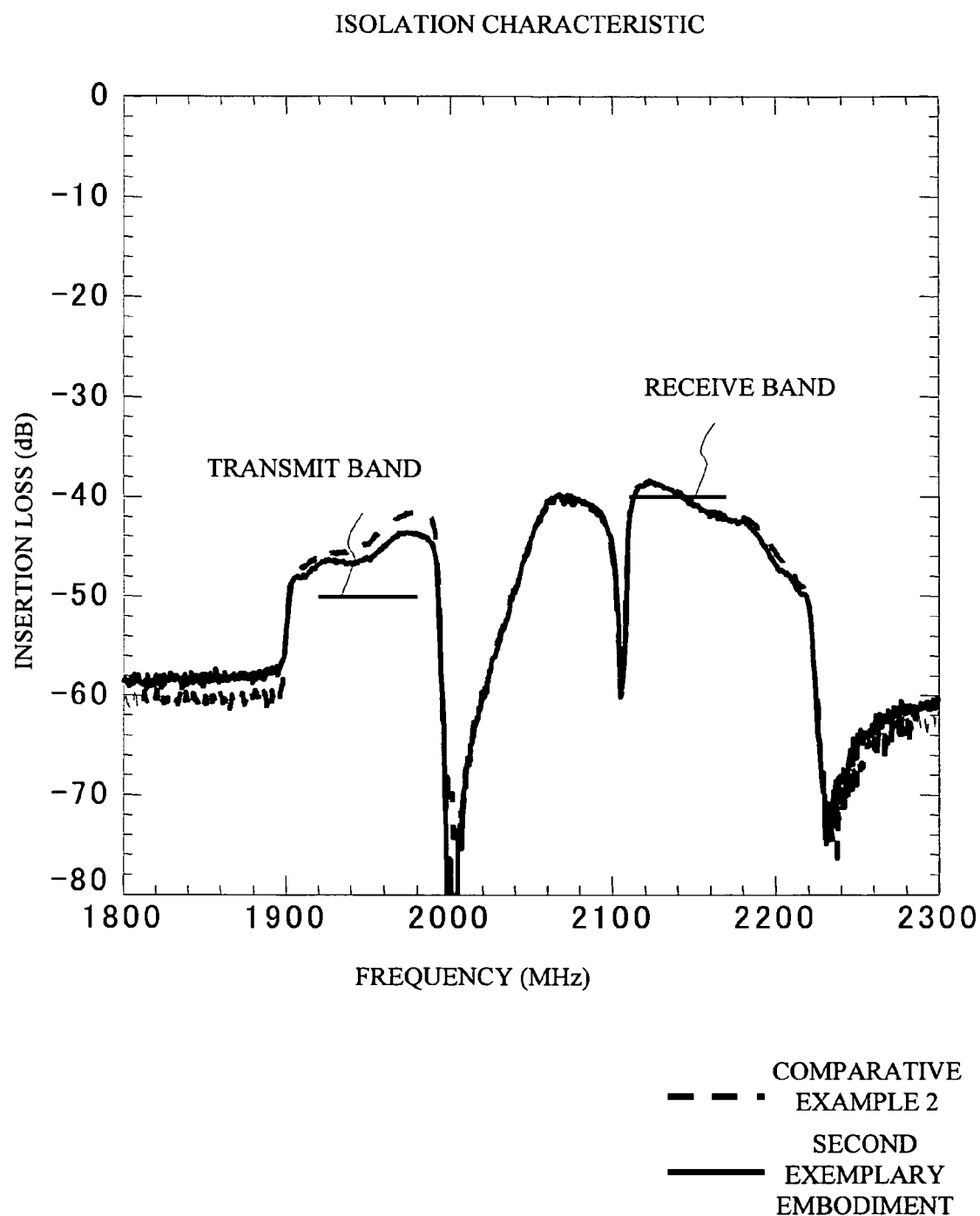
FIG. 11 shows isolation characteristic of the duplexer employed in the second exemplary embodiment and that of the comparative example 2.

FIG. 11 shows isolation characteristic of the duplexer employed in the second exemplary embodiment and that of the comparative example 2. In the duplexer employed in the second exemplary embodiment, the isolation characteristic in the transmit band is more improved than that of the comparative example 2. That is to say, the filter characteristic of high suppression is obtained. This is because the mutual inductance between the first receiving inductance L21 and the second receiving inductance L22 can be suppressed. As described, the first receiving ground line pattern RG1L and the second receiving ground line pattern RG2L are provided on different layers, thereby enabling the isolation characteristic of the duplexer to be improved. Also, as described in the first exemplary embodiment, the transmitting ground line pattern TGL may be provided on a different layer from at least one of the first receiving ground line pattern RG1L and the second receiving ground line pattern RG2L, and the first receiving ground line pattern RG1L and the second receiving ground line pattern RG2L may be provided on different layers.

Third Exemplary Embodiment

Figure 12A:
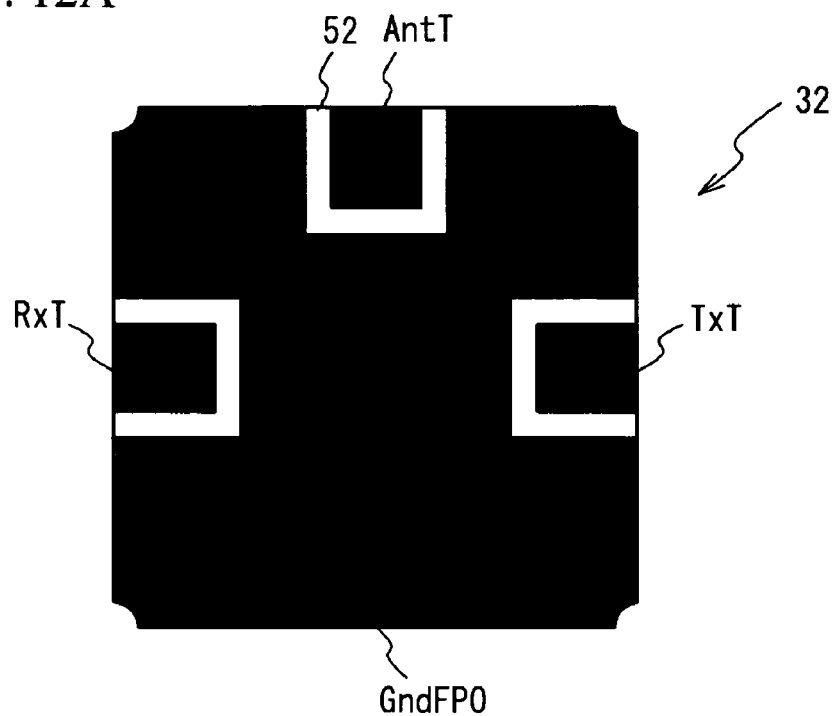
FIG. 12A shows a footpad layer in the duplexer of a comparative example 3, in which the ceramic coat is not shown.
Figure 12B:
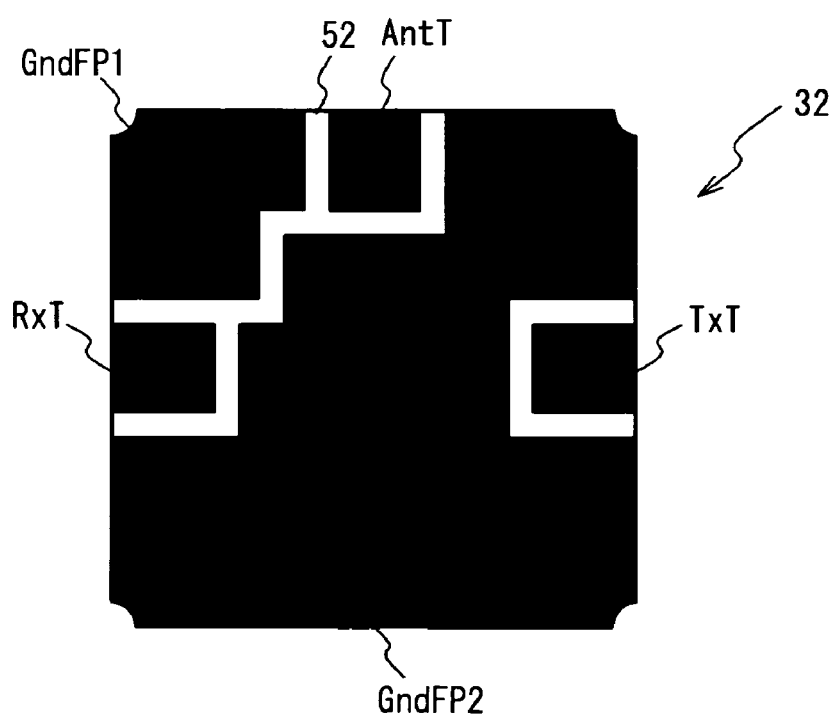
FIG. 12B shows the footpad layer in the duplexer employed in the first exemplary embodiment of the present invention, in which the ceramic coat is not shown.

FIG. 12A shows the footpad layer 32 in the duplexer of comparative example 3, in which the ceramic coat is not shown. FIG. 12B shows the footpad layer 32 in the duplexer employed in the first exemplary embodiment of the present invention, in which the ceramic coat is not shown. Referring to FIG. 12B, in the duplexer employed in the first exemplary embodiment, the ground footpad GndFP1 is electrically separated and isolated from the ground footpad GndFP2, the ground footpad GndFP1 being coupled to the first receiving ground line pattern RG1L, which is the line pattern coupled to the parallel resonators P21 and P22 at the side of the common terminal Ant of the receive filter 12, the ground footpad GndFP2 being coupled to the second receiving ground line pattern RG2L and the transmitting ground line pattern TGL. Meanwhile, referring now to FIG. 12A, in the duplexer of a comparative example 3, the transmitting ground line pattern TGL, the first receiving ground line pattern RG1L, and the second receiving ground line pattern RG2L are coupled to an identical ground footpad GndFP0. In the comparative example 3, the same components and configurations as those employed in the first exemplary embodiment have the same reference numerals and a detailed explanation will be omitted.

Figure 13:
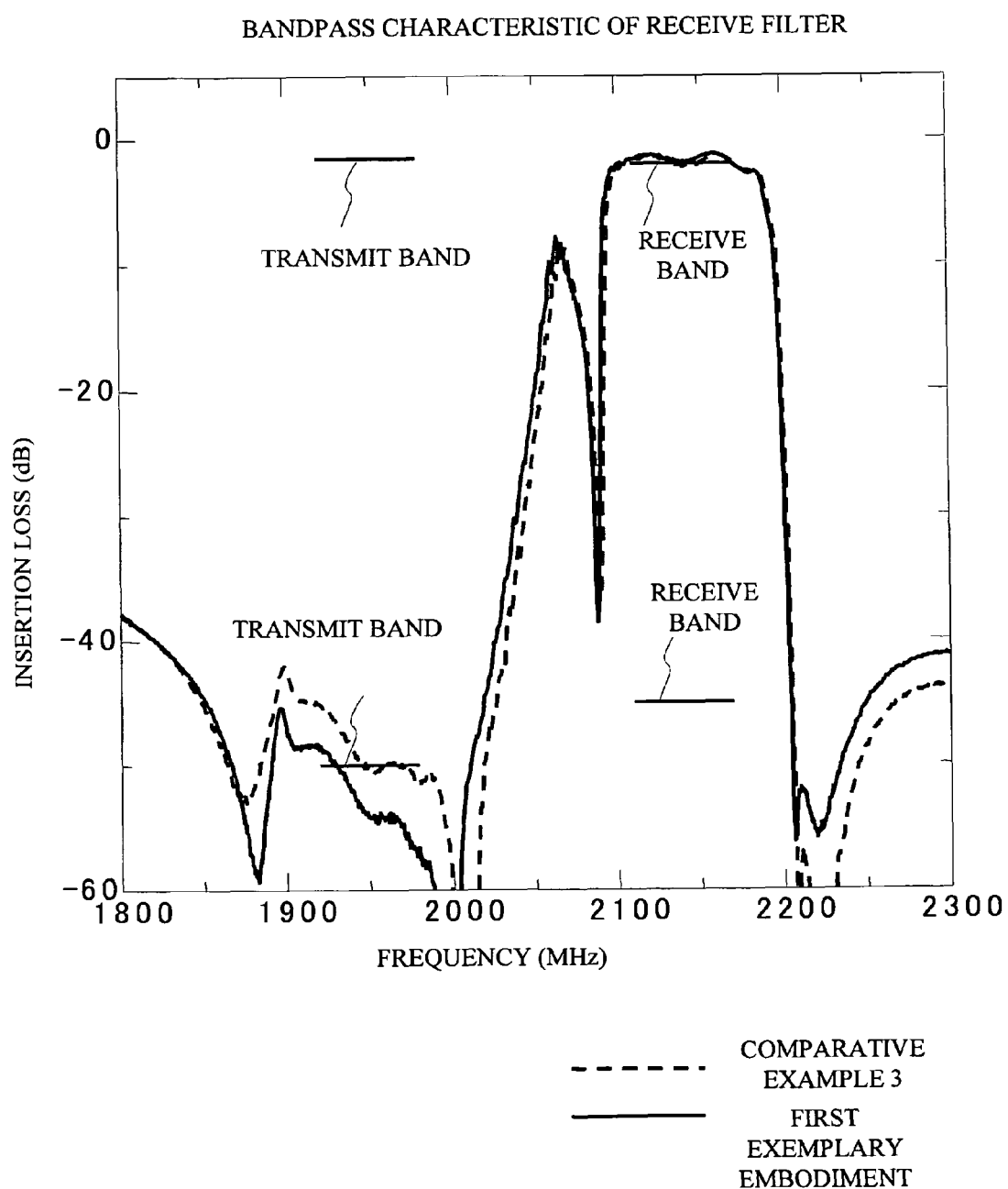
FIG. 13 shows bandpass characteristics of the receive filter in the duplexer employed in the first exemplary embodiment and that of the comparative example 3, and also shows the insertion loss in the frequency.

FIG. 13 shows bandpass characteristics of the receive filter 12 in the duplexer employed in the first exemplary embodiment and that of the comparative example 3, and also shows the insertion loss in the frequency. The attenuation characteristics of the duplexer employed in the first exemplary embodiment is more improved in the transmit band of the receive filter 12 than that of the comparative example 3. That is to say, the filter characteristic of high suppression is obtained.

Figure 14A:
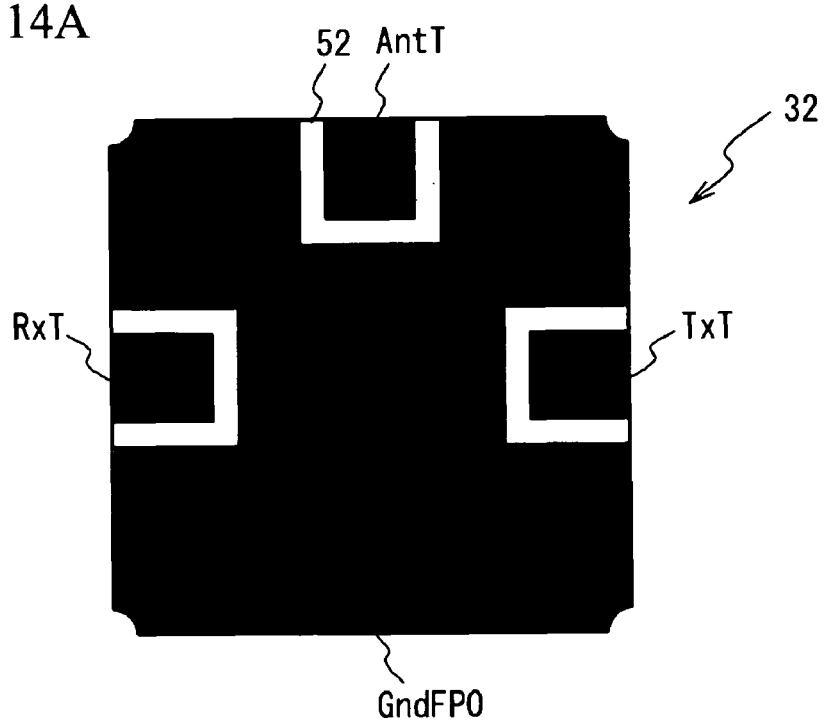
FIG. 14A shows the footpad layer in the duplexer of comparative example 3, in which the ceramic coat is not shown.
Figure 14B:
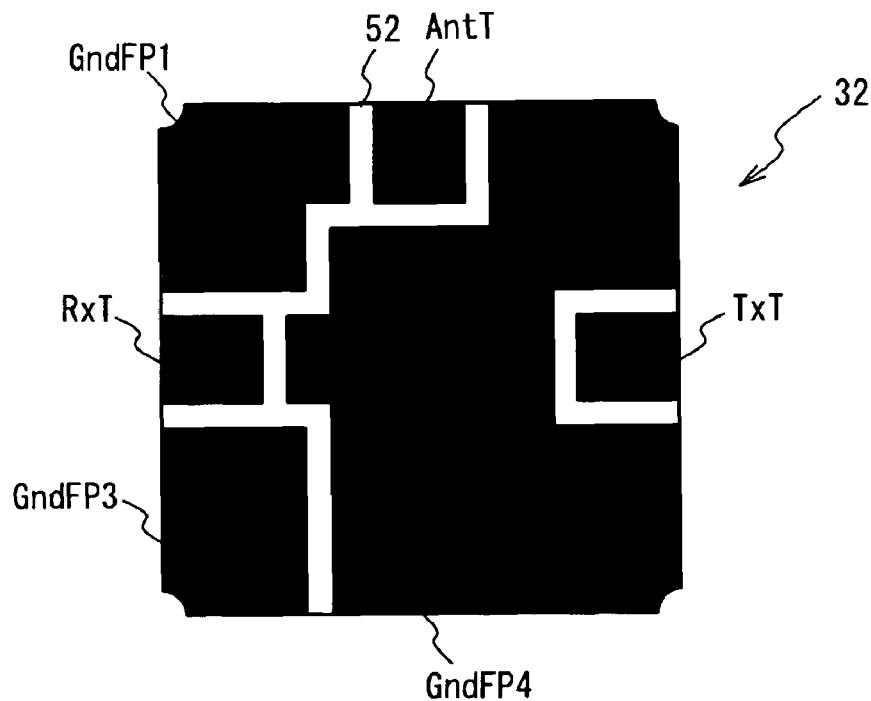
FIG. 14B shows the footpad layer in the duplexer employed in the third exemplary embodiment of the present invention, in which the ceramic coat is not shown.

FIG. 14A shows the footpad layer 32 in the duplexer of the comparative example 3, in which the ceramic coat is not shown. FIG. 14B shows the footpad layer 32 in the duplexer employed in the third exemplary embodiment of the present invention, in which the ceramic coat is not shown. FIG. 14A is identical to FIG. 12A, and a description will be omitted. Referring now to FIG. 14B, in the duplexer employed in the third exemplary embodiment, the transmitting ground line pattern TGL is coupled to a ground footpad GndFP4, the first receiving ground line pattern RG1L is coupled to the ground footpad GndFP1, and the second receiving ground line pattern RG2L is coupled to a ground footpad GndFP3. Also, the ground footpads GndFP1, GndFP3, and GndFP4 are electrically separated and isolated from each other. In the third exemplary embodiment, the same components and configurations as those of the comparative example 3 have the same reference numerals and a detailed explanation will be omitted.

FIG. 15 shows bandpass characteristics of the transmit filter 10 and that of the receive filter 12 in the duplexer employed in the third exemplary embodiment and that of the comparative example 3, and also shows the insertion loss in the frequency of the transmit filter 10 and that of the receive filter 12. The attenuation characteristics of the duplexer employed in the third exemplary embodiment is more improved in the transmit band of the receive filter 12 and in the receive band of the transmit filter 10 than that of the comparative example 3. That is to say, the filter characteristic of high suppression is obtained.

Figure 16A:
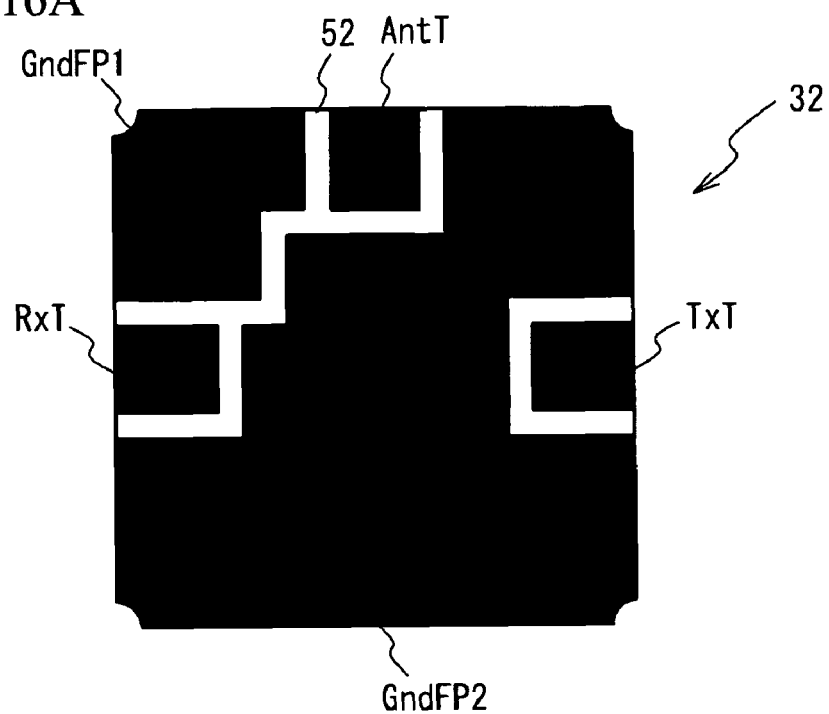
FIG. 16A shows the footpad layer in the duplexer employed in the first exemplary embodiment of the present invention, in which the ceramic coat is not shown.
Figure 16B:
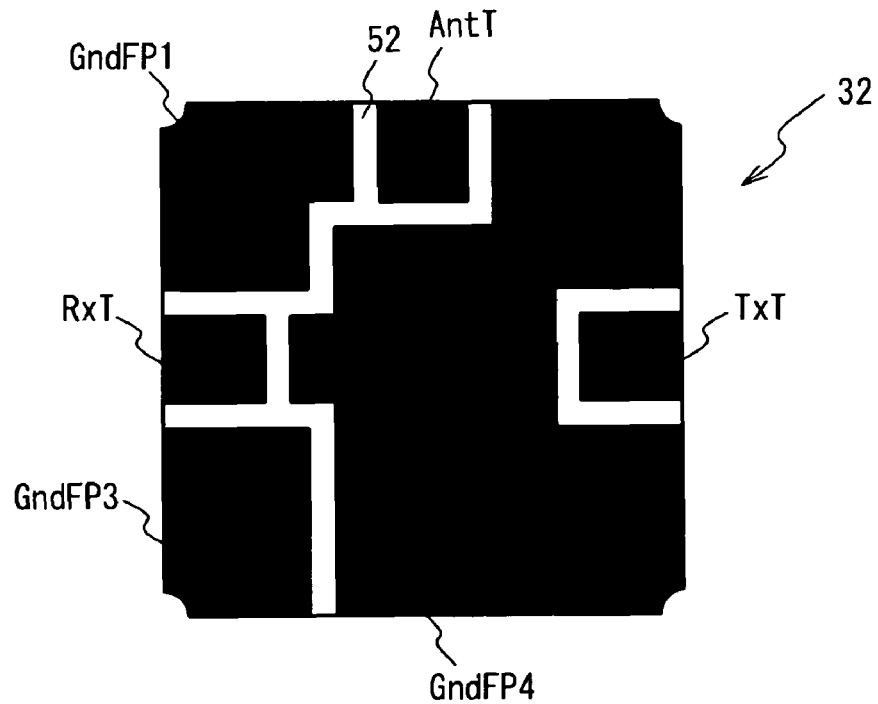
FIG. 16B shows the footpad layer in the duplexer employed in the third exemplary embodiment of the present invention, in which the ceramic coat is not shown.

FIG. 16A shows the footpad layer 32 in the duplexer employed in the first exemplary embodiment of the present invention, in which the ceramic coat is not shown. FIG. 16B shows the footpad layer 32 in the duplexer employed in the third exemplary embodiment of the present invention, in which the ceramic coat is not shown. FIG. 16A is identical to FIG. 12B, FIG. 16B is identical to FIG. 14B, and a description will be omitted.

Figure 17:
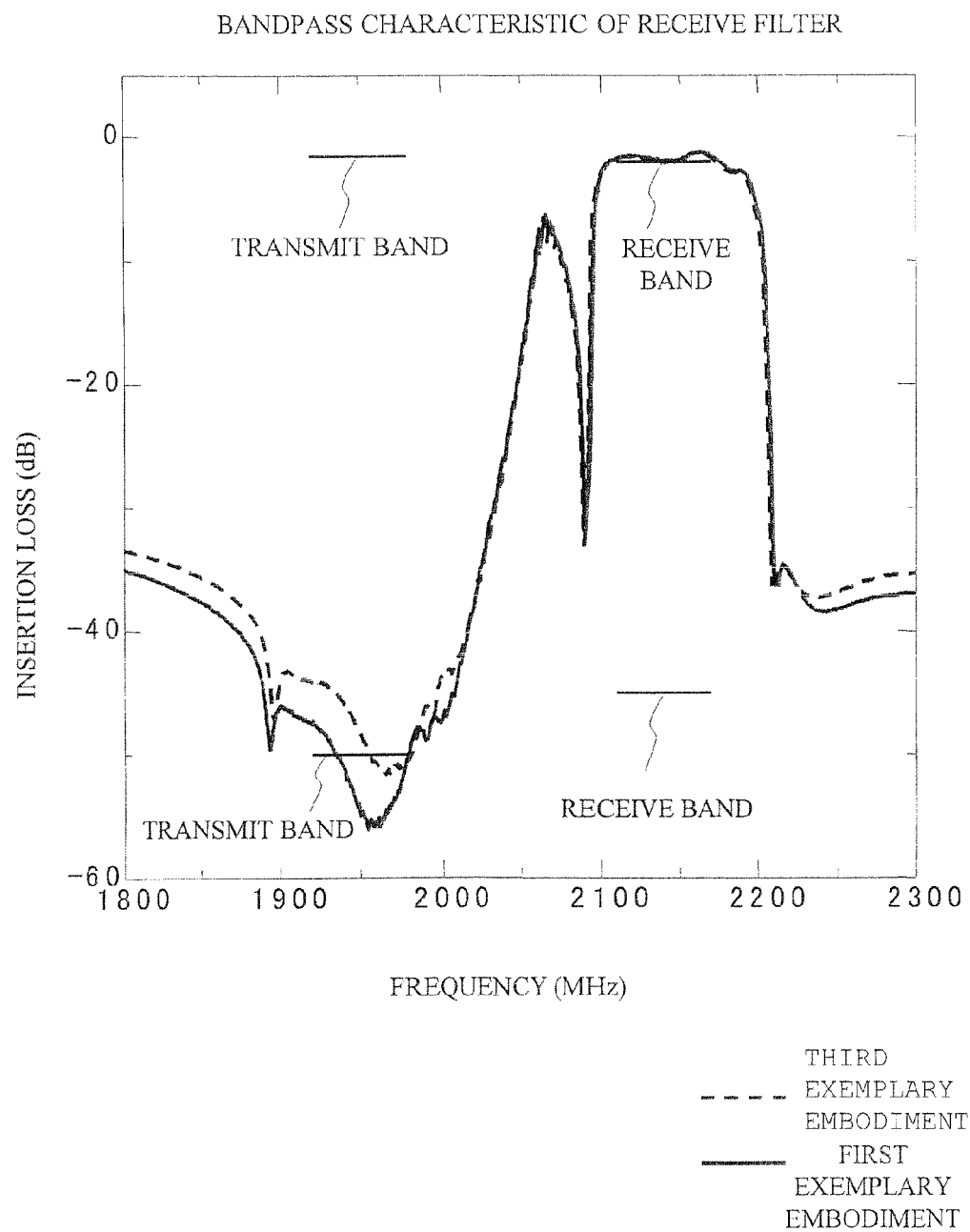
FIG. 17 shows bandpass characteristics of the duplexer employed in the first exemplary embodiment and that employed in the third exemplary embodiment, and also shows the insertion loss in the frequency.

FIG. 17 shows bandpass characteristics of the duplexer employed in the first exemplary embodiment and that employed in the third exemplary embodiment, and also shows the insertion loss in the frequency. The attenuation characteristics of the duplexer employed in the first exemplary embodiment is more improved in the transmit band of the receive filter 12 than that employed in the third exemplary embodiment. That is to say, the filter characteristic of high suppression is obtained.

As shown in the first exemplary embodiment of FIG. 13 and the third exemplary embodiment of FIG. 15, the ground footpad, to which at least one of the first receiving ground line pattern RG1L and the second receiving ground line pattern RG2L is coupled, is separated from the ground pad to which the transmitting ground line pattern TGL is coupled. This can reduce the coupling between grounds, thereby improving the attenuation characteristic.

The above-described configuration of the ground footpads may be applicable independently of the configuration of which layers the transmitting ground line pattern TGL, the first receiving ground line pattern RG1L, and the second receiving ground line pattern RG2L are provided, as in the first exemplary embodiment, the comparative example 1, the second exemplary embodiment, and the comparative example 2.

Fourth Exemplary Embodiment

FIG. 18A through FIG. 18C respectively show the die attach layer 26, the line pattern layer 28, and the line pattern/footpad layer 30 in the duplexer of a comparative example 4. FIG. 18D through FIG. 18F respectively show the die attach layer 26, the line pattern layer 28, and the line pattern/footpad layer 30 in the duplexer employed in a fourth exemplary embodiment of the present invention. In the duplexer of the comparative example 4 and that employed in the fourth exemplary embodiment, the second receiving ground line pattern RG2L, the first receiving ground line pattern RG1L, and the transmitting ground line pattern TGL are provided on the same line pattern/footpad layer 30. In the fourth exemplary embodiment and the comparative example 4, the same components and configurations as those employed in the first exemplary embodiment have the same reference numerals and a detailed explanation will be omitted.

In the comparative example 4, the first receiving ground line pattern RG1L and the transmitting-ground line pattern TGL substantially have the same current directions, and the second receiving ground line pattern RG2L and the transmitting ground line pattern TGL substantially-have the same current directions. Meanwhile, in the fourth exemplary embodiment, the first receiving ground line pattern RG1L has the upward and left-hand current directions, as shown in FIG. 18F. The current directions of the first receiving ground line pattern RG1L are opposite of those of the transmitting ground line pattern TGL. The second receiving ground line pattern RG2L has a left-hand current direction, whereas the transmitting ground line pattern TGL has a right-hand current direction. As described, the current direction of the second receiving ground line pattern RG2L is opposite to that of the transmitting ground line pattern TGL. Here, the opposite current direction denotes that the current directions are downward and right-hand directions and upward and left-hand directions, namely, clockwise direction and counterclockwise direction, as shown by the transmitting ground line pattern TGL and the first receiving ground line pattern RG1L in FIG. 18F. The opposite current direction also denotes that substantially linear current directions are reversed directions such as right-hand direction and left-hand direction, as shown by the transmitting ground line pattern TGL and the second receiving ground line pattern RG2L.

Figure 19:
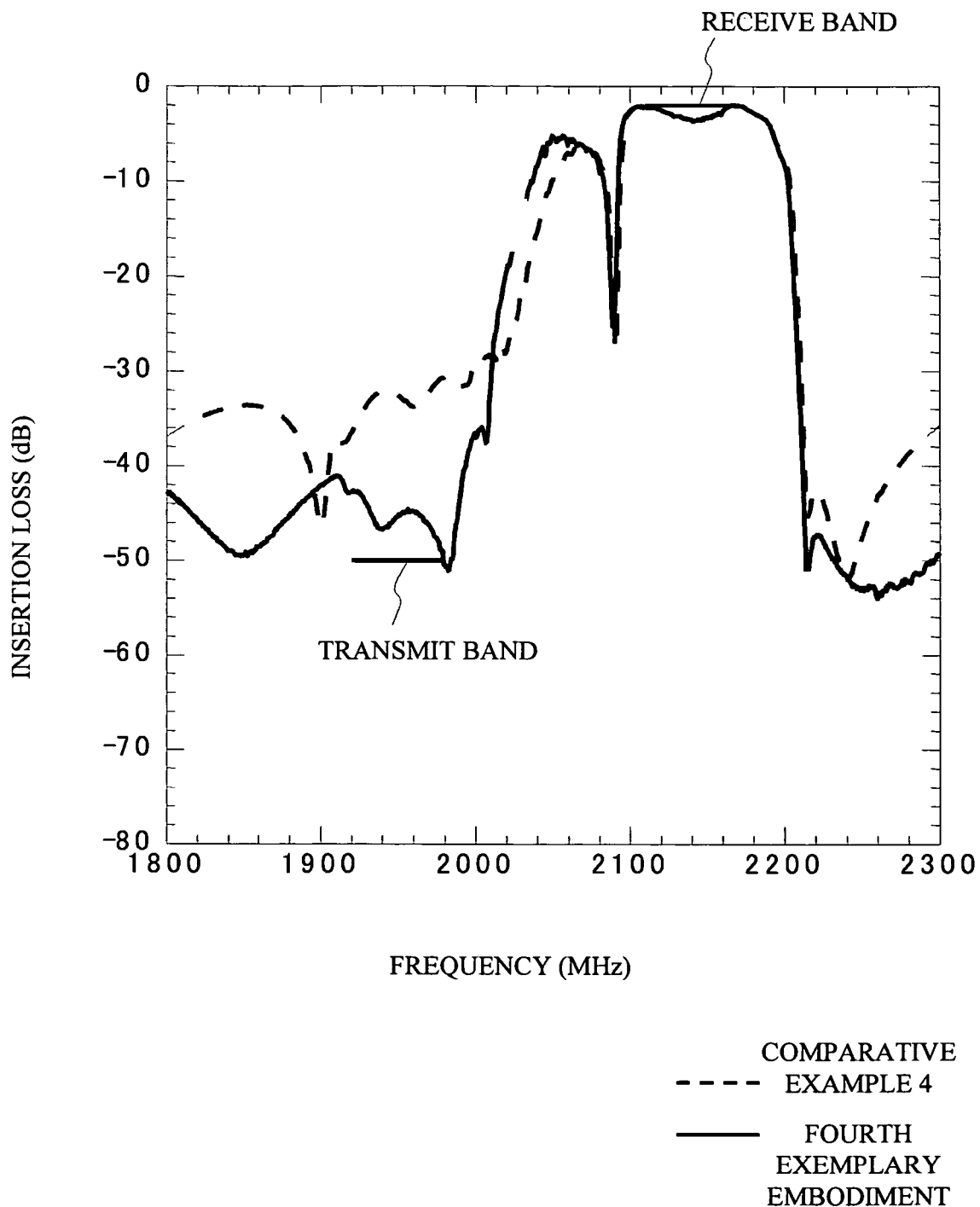
FIG. 19 shows bandpass characteristics of receive filter in the duplexer employed in the fourth exemplary embodiment and that of the comparative example 4, and also shows the insertion loss in the frequency.

FIG. 19 shows bandpass characteristics of the receive filter 12 in the duplexer employed in the fourth exemplary embodiment and that of the comparative example 4, and also shows the insertion loss in the frequency. The attenuation characteristics of the duplexer employed in the fourth exemplary embodiment is more improved in the transmit band of the receive filter 12 than that of the comparative example 4. That is to say, the filter characteristic of high suppression is obtained. As described, in the duplexer employed in the fourth exemplary embodiment, the mutual inductance between the receiving ground line patterns RG1L and RG2L and the transmitting ground line pattern TGL is smaller than that of the comparative example 4, by making the current directions opposite to each other between the receiving ground line patterns RG1L and RG2L and the transmitting ground line pattern TGL. This enables the attenuation characteristic of the duplexer to be improved.

As described heretofore, the attenuation characteristic can be improved by making the direction of the current flowing across the transmitting ground line pattern TGL opposite to at least one of the direction of the current flowing through the first receiving ground line pattern RG1L and that flowing through the second receiving ground line pattern RG2L, and by making the mutual inductance small between the transmitting ground line pattern TGL and at least one of the first receiving ground line pattern RG1L and the second receiving ground line pattern RG2L. In particular, the attenuation characteristic can be further improved by making the direction of the current flowing through the transmitting ground line pattern TGL opposite to the direction of the current flowing through the first receiving ground line pattern RG1L and that flowing through the second receiving ground line pattern RG2L, and by making the mutual inductance small between the transmitting ground line pattern TGL and the first receiving ground line pattern RG1L and the second receiving ground line pattern RG2L.

In the fourth exemplary embodiment of the present invention, the description has been given of a case where the transmitting ground line pattern TGL, the first receiving ground line pattern RG1L, and the second receiving ground line pattern RG2L are provided on an identical layer. However, the mutual inductance can be suppressed even in the duplexer employed in an alternative exemplary embodiment or comparative example in which the above-described ground line patterns are provided different layers, for example, by making the direction of the current flowing through the transmitting ground line pattern TGL substantially opposite to at least one of the direction of the current flowing through the first receiving ground line pattern RG1L and that flowing through the second receiving ground line pattern RG2L. This also enables the attenuation characteristic of the duplexer to be improved.

Fifth Exemplary Embodiment

FIG. 20A through FIG. 20C respectively show the die attach layer 26, the line pattern layer 28, and the line pattern/footpad layer 30 in the duplexer employed in the first exemplary embodiment. FIG. 20D through FIG. 20F respectively show the die attach layer 26, the line pattern layer 28, and the line pattern/footpad layer 30 in the duplexer employed in a fifth exemplary embodiment of the present invention. In the duplexer employed in the first exemplary embodiment and that employed in the fifth exemplary embodiment, there are provided on the die attach layer 26: a common signal line pattern MTL that couples through the transmit filter 10 and the matching circuit 14 to the common terminal Ant; and another common signal line pattern MRL that couples through the receive filter 12 and the matching circuit 14 to the common terminal Ant. There are also provided on the die attach layer 26: a transmitting signal line pattern TSL that couples the transmit filter 10 and the transmitting terminal Tx; and a receiving signal line pattern RSL that couples the receive filter 12 and the receiving terminal Rx.

In addition, there are provided on the line pattern layer 28: partition ground lines SL1 and SL2 to partially overlap the common signal line patterns MRL and MTL, namely, at corresponding positions. The dotted lines in FIG. 20D indicate the corresponding positions of the partition ground lines SL1 and SL2. The partition ground lines SL1 and SL2 are coupled through vias SL1V and SL2V provided on the line pattern/footpad layer 30 to the ground footpad. The partition ground lines SL1 and SL2 are provided for reducing the bridging capacity between the common signal line pattern MRL and the receiving signal line pattern RSL and that between the common signal line pattern MTL and the transmitting line pattern TSL. Here, the receiving signal line pattern RSL and the transmitting signal line pattern TSL are also referred to as transmitting/receiving signal line pattern.

Figure 21A:
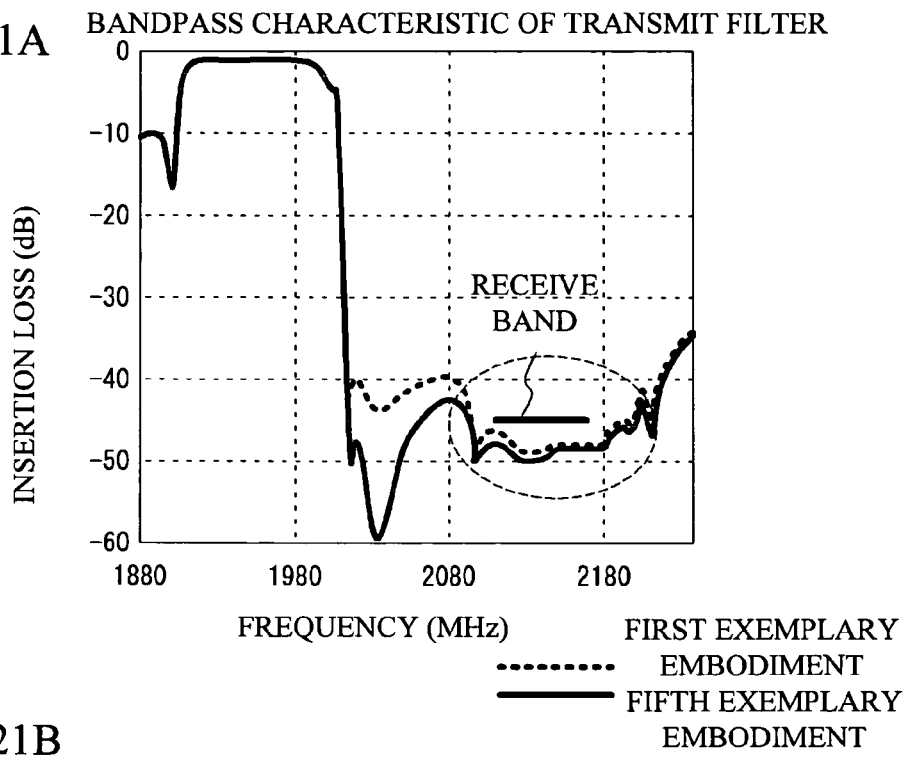
FIG. 21A shows bandpass characteristics of the duplexer employed in the first exemplary embodiment and that employed in the fifth exemplary embodiment, and also shows the insertion loss in the frequency.
Figure 21B:
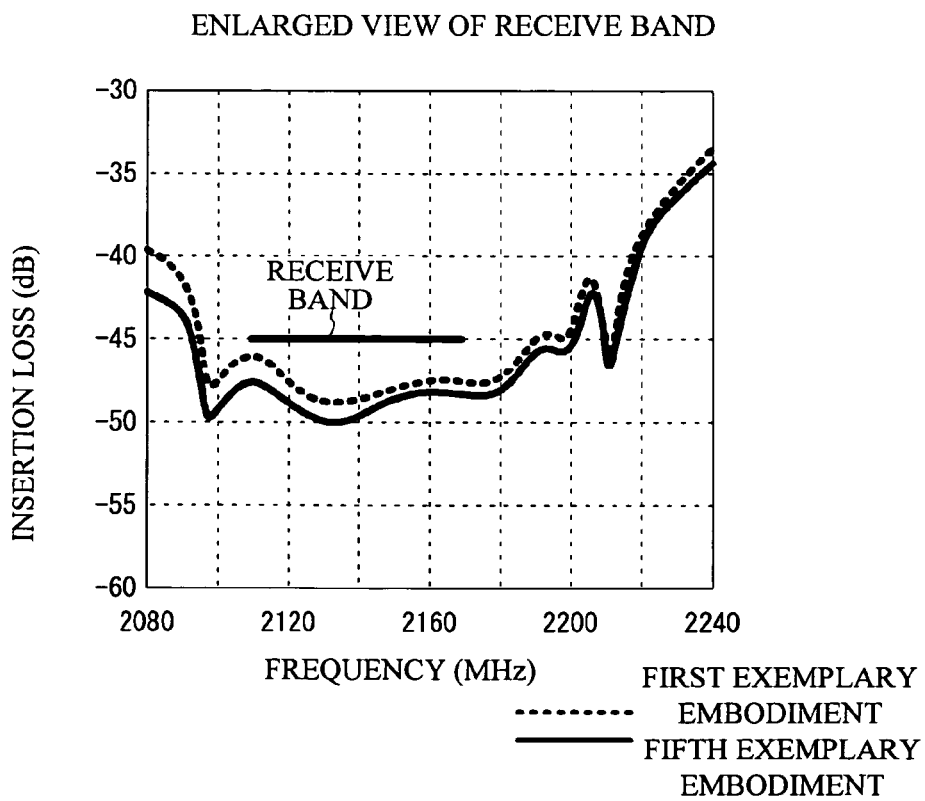
FIG. 21B is an enlarged view of the receive band shown in FIG. 21A.

FIG. 21A shows bandpass characteristics of the duplexer employed in the first exemplary embodiment and that employed in the fifth exemplary embodiment, and also shows the insertion loss in the frequency. FIG. 21B is an enlarged view of the receive band shown in FIG. 21A. The attenuation characteristics of the duplexer employed in the fifth exemplary embodiment is more improved in the receive band of the transmit filter 10 than that employed in the first exemplary embodiment. That is to say, the filter characteristic of high suppression is obtained. As described, the attenuation characteristic of the duplexer can be improved by providing the partition ground line patterns SL1 and SL2 to reduce the bridging capacitance between the common signal line pattern MRL and the receiving signal line pattern RSL and that between the common signal line pattern MTL and the transmitting signal line pattern TSL.

The partition ground line patterns SL1 and SL2 may be respectively arranged closer to the transmitting/receiving signal line patterns RSL and TSL. In the afore-described case, however, the impedance of the receiving terminal Rx and that of the transmitting terminal Tx are changed to degrade the impedance matching. Meanwhile, if the partition ground line patterns SL1 and SL2 are respectively provided close to the common signal line pattern MRL and the common signal line pattern MTL, the impedances are changed. The impedances, however, can be adjusted with ease by changing the matching circuit 14. Therefore, it is preferable that the partition ground line patterns SL1 and SL2 be respectively provided close to the common signal line pattern MRL and the common signal line pattern MTL. As in the fifth exemplary embodiment, it is more preferable that the partition ground line patterns SL1 and SL2 be provided at the positions corresponding to the common signal line pattern MRL and the common signal line pattern MTL on a layer different from that on which the common signal line patterns MRL and MTL are provided. This can reduce the mounting area of the stacked package 20.

In the fifth exemplary embodiment, the description has been given of the case where the partition ground line patterns SL1 and SL2 are added to the configuration of the duplexer employed in the first exemplary embodiment. However, the partition ground line patterns SL1 and SL2 may be applicable to any of the duplexers employed in the exemplary embodiments and the comparative examples.

Figure 22A:
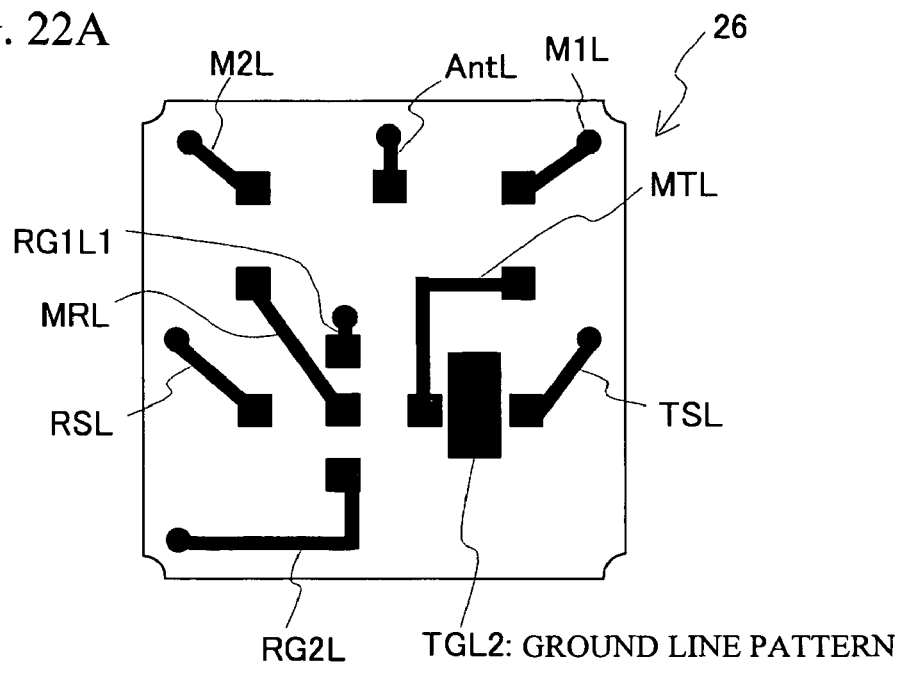
FIG. 22A shows the die attach layer of the duplexer of a comparative example 5.
Figure 22B:
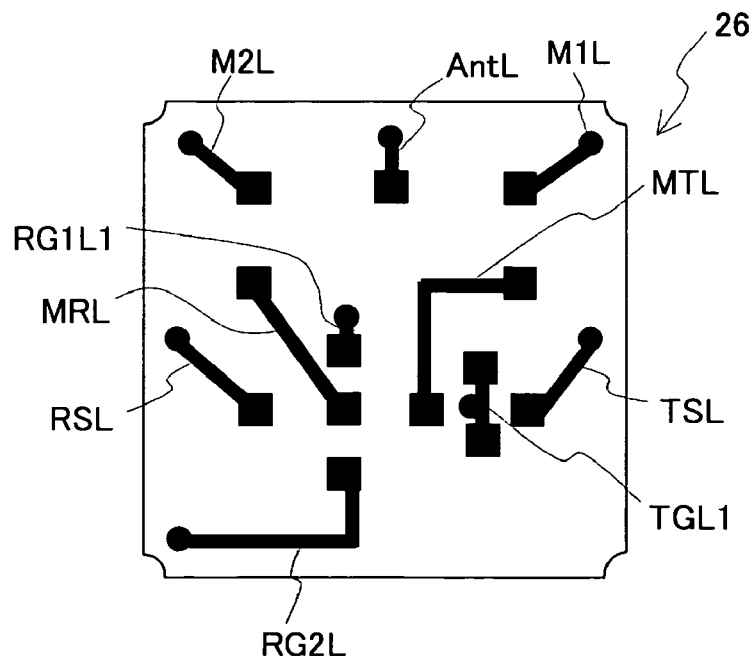
FIG. 22B shows the die attach layer of the duplexer employed in the first exemplary embodiment of the present invention.

FIG. 22A shows the die attach layer 26 of the duplexer of a comparative example 5. FIG. 22B shows the die attach layer 26 of the duplexer employed in the first exemplary embodiment. Referring now to FIG. 22A, in the duplexer of the comparative example 5, the width of a ground line pattern TGL2 is greater than that of each of the bump pads, the ground line pattern TGL2 being coupled to the bump pads to which the pads provided on the ground sides of the parallel resonators P11 and P12 of the transmit filter 10 are coupled. In the duplexer of the comparative example 5, the same components and configurations as those employed in the first exemplary embodiment have the same reference numerals and a detailed explanation will be omitted. Referring now to FIG. 22B, in the duplexer employed in the first exemplary embodiment, the width of the ground line pattern TGL1 is smaller than that of each of the bump pads.

Figure 23A:
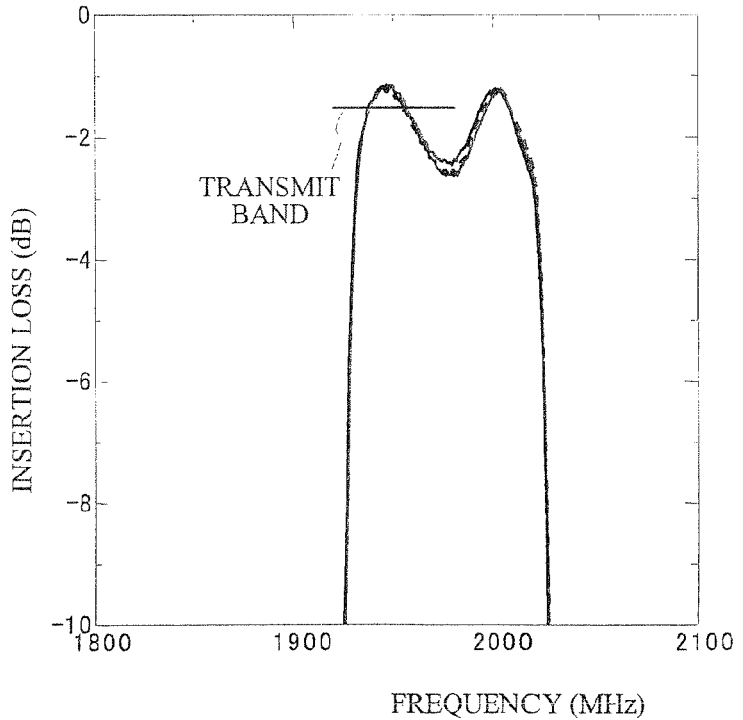
FIG. 23A shows bandpass characteristics of the transmit filter of the duplexer employed in the first exemplary embodiment and that of the comparative example 5, and also shows the insertion loss in the frequency.
Figure 23B:
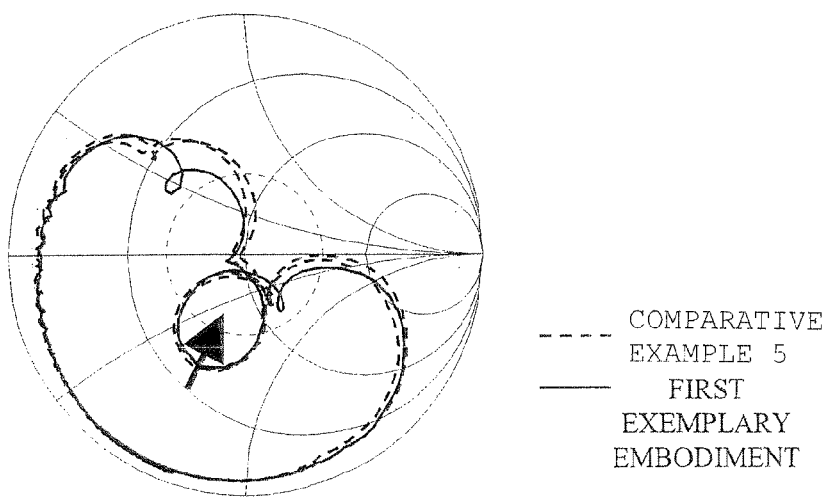
FIG. 23B is a smith chart showing reflection characteristics of the transmitting terminal.

FIG. 23A shows bandpass characteristics of the transmit filter 10 in the duplexer employed in the first exemplary embodiment and that of the comparative example 5, and also shows the insertion loss in the frequency. The insertion loss in the transmit band of the transmit filter 10 in the duplexer employed in the first exemplary embodiment is smaller than that of the duplexer of the comparative example 5. That is to say, the filter characteristic of low insertion loss is obtained. The capacitance of the signal line of the duplexer employed in the first exemplary embodiment can be more reduced than that of the comparative example 5, as indicated by the arrow shown in FIG. 23B. In this manner, the capacitance between the signal line on the surface of the filter chip 18 and the ground line pattern can be reduced by making the width of the ground line pattern TGL1 smaller than that of the bump pad. This makes the filter characteristic of low insertion loss obtainable. The ground line pattern which width is made smaller than that of the bump pad is not limited to the transmitting ground line pattern. Any other ground line pattern having a width smaller than that of the bump pad makes it possible to reduce the capacitance with the signal line formed on the surface of the phase matching circuit chip 16 or the filter chip 18. It is therefore possible to obtain the filter characteristics with low insertion loss.

Sixth Exemplary Embodiment

Figure 24:
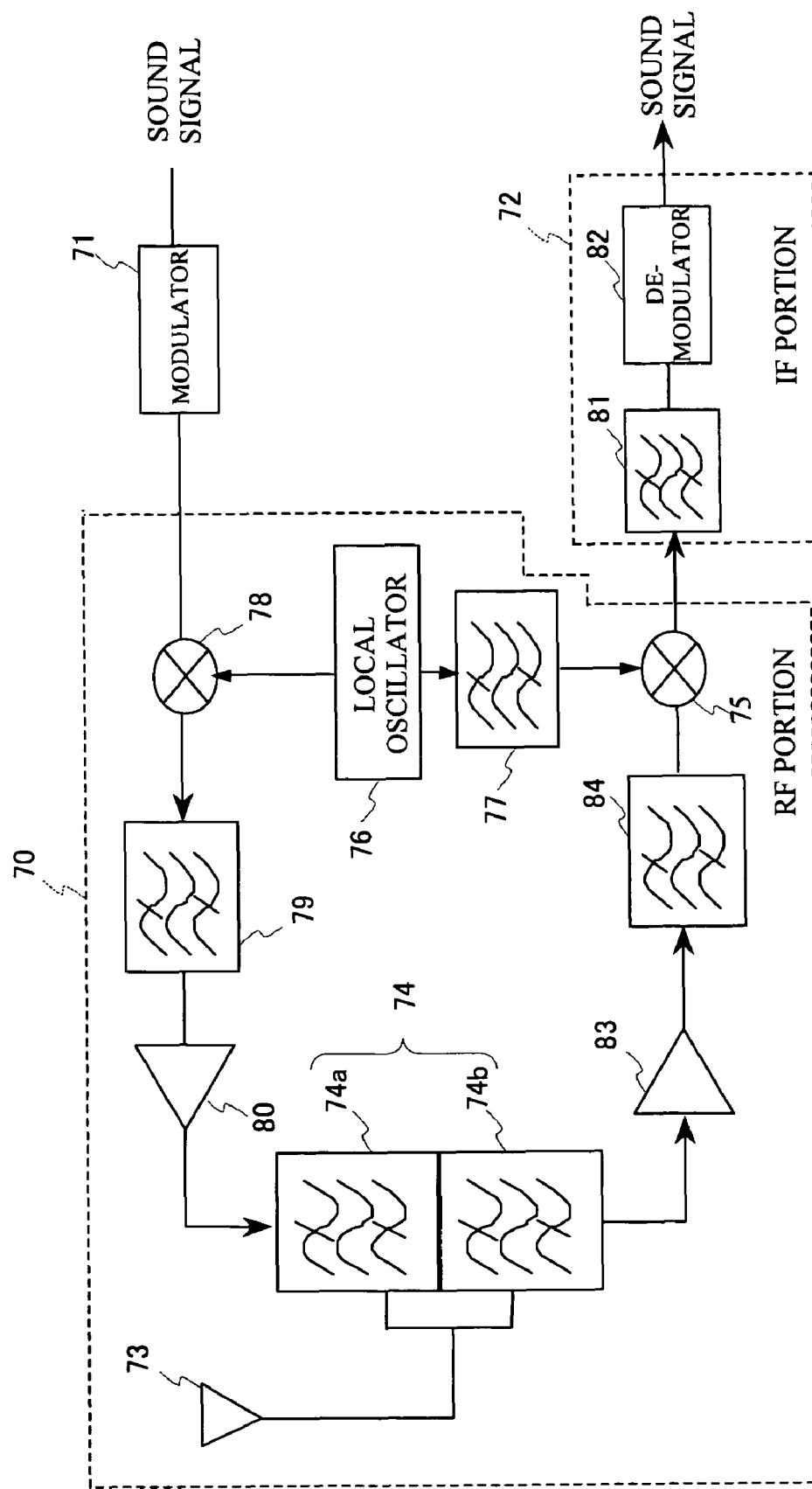
FIG. 24 is a block diagram of an electronic apparatus employed in a sixth exemplary embodiment of the present invention.

FIG. 24 is a block diagram of an electronic apparatus employed in a sixth exemplary embodiment of the present invention. The electronic apparatus is a transmitting/receiving system of a mobile telephone. The transmitting/receiving system of the mobile telephone includes: an RF portion 70; a modulator 71; and an IF portion 72. The RF portion 70 includes: an antenna 73; a duplexer 74; a low noise amplifier 83; an interstage filter 84; a mixer 75; a local oscillator 76; an interstage filter 77; a mixer 78; an interstage filter 79; and a power amplifier 80. A sound signal input from a sound processing system is modulated in the modulator 71, and is converted into frequency at the mixer 78 of the RF portion 70 by use of an oscillation signal of the local oscillator 76. The signal output from the mixer 78 passes through the interstage filter 79 and the power amplifier 80 to the duplexer 74.

The duplexer 74 is any of the duplexers employed in the first through fifth exemplary embodiments of the present invention, and includes: a transmit filter 74a; a receive filter 74b; and a matching circuit, not shown. The signal transmitted form the power amplifier 80 is fed through the transmit filter 74*a* of the duplexer 74 to the antenna 73. The signal received at the antenna 73 passes through the receive filter 74*b* of the duplexer 74, the low noise amplifier 83, and the interstage filter 84, to the mixer 75. The mixer 75 receives the oscillation frequency of the local oscillator 76 by way of the interstage filter 77, and converts the frequency of the received signal to output to the IF portion 72. The IF portion 72 receives the signal by way of an IF filter 81, the signal is demodulated at a demodulator 82, and a sound signal is output to the sound processing system.

The electronic apparatus employed in the sixth exemplary embodiment includes any of the duplexers employed in the first through fifth exemplary embodiments of the present invention. Therefore, it is possible to provide a high-performance electronic apparatus.

In the duplexers employed in the first through fifth exemplary embodiments, out of the first receiving ground line pattern RG1L and the second receiving ground line pattern RG2L, one arranged closer to the periphery of the stacked layers has a longer ground line pattern than that of the other. In the duplexers employed in the first through fourth exemplary embodiments, the second receiving ground line pattern RG2L closer to the periphery of the stacked layers is longer than the first receiving ground line pattern RG1L. For this reason, the second receiving ground line pattern RG2L has a larger inductance than that of the first receiving ground line pattern RG1L. It is possible to provide a longer ground line pattern near the periphery of the stacked layers than that provided at the center portion thereof. This makes it possible to arrange the receiving ground line pattern in a more efficient manner by making the inductance of the receiving ground line pattern closer to the periphery of the stacked layers greater than that of the other receiving ground line pattern. This enables the stacked package to be small-sized. Here, the present invention is not limited to the first receiving ground line pattern RG1L and the second receiving ground line pattern RG2L provided on an identical layer. Even if the first receiving ground line pattern RG1L and the second receiving ground line pattern RG2L are provided on different layers, the stacked package can be small-sized by making the inductance of the receiving ground line pattern arranged closer to the periphery of the stacked layers greater.

The filter chip 18 that includes the transmit filter 10 and the receive filter 12, and the phase matching circuit chip 16 may be face-up mounted, although there arises a drawback that wiring necessary for the face-up mounting increases the device height. For this reason, face-down mounting is desirable to reduce the device size. If the filter chip 18 is face-down mounted, the inductance cannot be formed of wiring, unlike face-up mounting. This necessitates that the transmitting inductance L11, and the receiving inductances L21, and L22 be formed of the ground line patterns provided on the stacked layers of the stacked package 20.

In the duplexers employed in the first through fifth exemplary embodiments, piezoelectric thin-film resonator filters are employed for the transmit filter 10 and the receive filter 12. At least one of a surface acoustic wave filter and piezoelectric thin-film resonator filter may be employed for the transmit filter 10 and the receive filter 12.

The duplexers employed in the first through fifth exemplary embodiments are examples of the duplexers for W-CDMA system operating at 2 GHz. The present invention, however, is not limited thereto, and is applicable to any other duplexer. In the duplexer for W-CDMA system operating at 2 GHz, the gap between the transmit band and the receive band is large as much as 130 MHz. In order to improve the attenuation characteristics of the opposite bandwidth, a large transmitting inductance L11 and the receiving inductances L21 and L22 are needed. It is therefor possible to further improve the attenuation characteristics and reduce the mounting area, by applying the present invention.

Finally, various aspects of the present invention are summarized in the following.

There is provided a duplexer including: a transmit filter of a ladder type filter, connected between a common terminal and a transmitting terminal; and a receive filter of the ladder type filter, connected between the common terminal and a receiving terminal, and one or more parallel resonators in the transmit filter are grounded through a transmitting inductance; and a portion of multiple parallel resonators are grounded through a first receiving inductance and a remaining portion of the multiple parallel resonators are grounded through a second receiving inductance.

The above-described duplexer may further include: a stacked package with multiple layers, in which the transmit filter and the receive filter are mounted; a transmitting ground line pattern provided on one of the multiple layers and partially composing the transmitting inductance; a first receiving ground line pattern provided on one of the multiple layers and partially composing the first receiving inductance; and a second receiving ground pattern provided on one of the multiple layers and partially composing the second receiving inductance. With the above-described configuration, the inductance can be reduced in size, and the package can be reduced in size.

In the above-described duplexer, the transmitting ground line pattern may be provided on a different layer from the first receiving ground line pattern and the second receiving ground line pattern. With the above-described configuration, it is possible to reduce the mutual inductance between the transmitting ground line pattern and at least one of the first receiving ground line pattern and the second receiving ground line pattern, thereby improving the attenuation characteristics of the duplexer.

In the above-described duplexer, the first receiving ground line pattern and the second receiving ground line pattern may be provided on different layers. With the above-described configuration, it is possible to reduce the mutual inductance between the first receiving ground line pattern and the second receiving ground line pattern, thereby improving the attenuation characteristics of the duplexer.

In the above-described duplexer, the stacked package may include ground footpads to couple ground of the transmit filter and that of the receive filter to the outside thereof; and the ground footpad to which at least one of the first receiving ground line pattern and the second receiving ground line pattern may be coupled is provided separately from the ground footpad to which the transmitting ground line pattern is coupled. With the above-described configuration, it is possible to reduce coupling between the transmitting ground line pattern and at least one of the first receiving ground line pattern and the second receiving ground line pattern, thereby improving the attenuation characteristics of the duplexer.

In the above-described duplexer, the first receiving inductance may be coupled to a parallel resonator arranged at a side of the common terminal of the receive filter; and a ground footpad, to which the second receiving ground line pattern and the transmitting ground line pattern may be commonly coupled, and is separated from the ground footpad to which the first receiving ground line pattern is coupled. With the above-described configuration, it is possible to further improve the attenuation characteristics.

In the above-described duplexer, a direction of a current flowing through the transmitting ground line pattern and the direction of the current flowing through at least one of the first receiving ground line pattern and the second receiving ground line pattern may be set to be a small mutual inductance between the transmitting ground line pattern and at least one of the first receiving ground line pattern and the second receiving ground line pattern. In the above-described duplexer, a direction of a current flowing through the transmitting ground line pattern may be opposite to the direction of the current flowing through at least one of the first receiving ground line pattern and the second receiving ground line pattern. With the above-described configuration, it is possible to reduce the mutual inductance between the transmitting ground line pattern and at least one of the first receiving ground line pattern and the second receiving ground line pattern, thereby improving the attenuation characteristics of the duplexer.

In the above-described duplexer, one of the first receiving ground line pattern and the second receiving ground line pattern, which is closer to a periphery of the multiple layers, may have a greater inductance than that of the other. It is therefore possible to arrange the line patterns effectively in the stacked layers to reduce the size of the stacked package.

The duplexer may further including: a common signal line pattern provided on one of the multiple layers to couple the common terminal and either the transmit filter or the receive filter; a transmitting/receiving signal line pattern provided on one of the multiple layers to couple the transmit filter and the transmitting terminal or to couple the receive filter and the receiving terminal; and a partition ground line pattern that reduces a bridging capacitance between the common signal line pattern and the transmitting/receiving signal line pattern. With the above-describe configuration, it is possible to reduce the bridging capacitance between the common signal line pattern and the transmitting/receiving signal line pattern. This enables the attenuation characteristics of the duplexer to be improved.

In the above-described duplexer, the partition ground line pattern may be arranged at a position that corresponds to the position of the common signal line pattern provided on a different layer from the common signal line pattern. With the above-described configuration, it is possible to reduce the bridging capacitance without impedance deviation.

In the above-described duplexer, a chip in which the transmit filter and the receive filter may be formed is face-down mounted on a die attach layer, which is one of the multiple layers. With the above-described configuration, the stacked package of the duplexer can be reduced in size.

The above-described duplexer may further include: a bump pad provided on the die attach layer to face-down mount the chip; and a ground line pattern provided on the die attach layer to couple the bump pad and ground, and a width of the bump pad may be smaller than that of the ground line pattern. With the above-described configuration, it is possible to reduce the capacitance between the ground pattern and the signal line formed on the surface of the filter chip, and it is possible to obtain the filter characteristic of low insertion loss.

In the above-described duplexer, the transmit filter and the receive filter may be made of at least one of a surface acoustic wave filter and a piezoelectric thin film resonator filter.

In the above-described duplexer, the duplexer may be used for a W-CDMA system operating at 2 GHz. The duplexer for the W-CDMA system operating at 2 GHz has a wide gap of 130 MHz between the transmit band and the receive band. Large transmitting and receiving inductances are needed for improving the attenuation characteristics of the opposite passbands. By applying the present invention to the duplexer for the W-CDMA system operating at 2 GHz, it is possible to further improve the attenuation characteristics and further reduce the mounting area.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

The present invention is based on Japanese Patent Application No. 2005-330335 filed on Nov. 15, 2005, the entire disclosure of which is hereby incorporated by reference.

What is claimed is:

1. A duplexer comprising:
a transmit filter of a ladder type filter, connected between a common terminal and a transmitting terminal, wherein the transmit filter includes one or more parallel resonators and a transmitting inductance, the one or more parallel resonators being grounded through the transmitting inductance;
a receiver filter of the ladder type filter, connected between the common terminal and a receiving terminal, wherein the receiver filter includes multiple parallel resonators, a first receiving inductance and a second receiving inductance, the multiple parallel resonators being grounded through the first receiving inductance and the second receiving inductance in a manner wherein at least one of the multiple parallel resonators is grounded through the first receiving inductance and the remainder multiple parallel resonators are grounded through the second receiving inductance, and wherein at least one of the first receiving inductance and the second receiving inductance is connected to more than one of the multiple parallel resonators;
a stacked package with multiple layers, in which the transmit filter and the receive filter are mounted;
a transmitting ground line pattern provided on one of the multiple layers and partially composing the transmitting inductance, wherein the transmitting ground line pattern is provided on a different layer from the first receiving ground line pattern and the second receiving ground line pattern; and
a first receiving ground line pattern provided on one of the multiple layers and partially composing the first receiving inductance; and
a second receiving ground pattern provided on one of the multiple layers and partially composing the second receiving inductance;
wherein the first receiving ground line pattern and the second receiving ground line pattern are not provided on the one of the multiple layers on which the transmitting ground line pattern is provided.

2. The duplexer as claimed in claim 1, wherein:
the stacked package includes ground footpads to electrically couple ground of the transmit filter and that of the receive filter to the outside thereof; and
the ground footpad to which at least one of the first receiving ground line pattern and the second receiving ground line pattern is electrically coupled is electrically separated from the ground footpad to which the transmitting ground line pattern is electrically coupled.

3. The duplexer as claimed in claim 1, wherein:
the first receiving inductance is electrically coupled to a parallel resonator arranged at a side of the common terminal of the receive filter; and a ground footpad, to which the second receiving ground line pattern and the transmitting ground line pattern are electrically commonly coupled, and is electrically separated from the ground footpad to which the first receiving ground line pattern is electrically coupled.

4. The duplexer as claimed in claim 1, wherein a direction of a current flowing through the transmitting ground line pattern and the direction of the current flowing through at least one of the first receiving ground line pattern and the second receiving ground line pattern are set to be a small mutual inductance between the transmitting ground line pattern and at least one of the first receiving ground line pattern and the second receiving ground line pattern.

5. The duplexer as claimed in claim 1, wherein a direction of a current flowing through the transmitting ground line pattern is opposite to the direction of the current flowing through at least one of the first receiving ground line pattern and the second receiving ground line pattern.

6. The duplexer as claimed in claim 1, wherein one of the first receiving ground line pattern and the second receiving ground line pattern, which is closer to a periphery of the multiple layers, has a greater inductance than that of the other.

7. The duplexer as claimed in claim 1, wherein a chip in which the transmit filter and the receive filter are formed is ace-down mounted on a die attach layer, which is one of the multiple layers.

8. The duplexer as claimed in claim 7, further comprising:
a bump pad provided on the die attach layer to face-down mount the chip; and
a ground line pattern provided on the die attach layer to couple the bump pad and ground,
wherein a width of the bump pad is smaller than that of the ground line pattern.

9. The duplexer as claimed in claim 1, wherein the transmit filter and the receive filter are made of at least one of a surface acoustic wave filter and a piezoelectric thin film resonator filter.

10. The duplexer as claimed in claim 1, wherein the duplexer is used for a W-CDMA system operating at 2 GHz.

11. A duplexer comprising:
a transmit filter of a ladder type filter, connected between a common terminal and a transmitting terminal, wherein the transmit filter includes one or more parallel resonators and a transmitting inductance, the one or more parallel resonators being grounded through the transmitting inductance;
a receiver filter of the ladder type filter, connected between the common terminal and a receiving terminal, wherein the receiver filter includes multiple parallel resonators, a first receiving inductance and a second receiving inductance, the multiple parallel resonators being grounded through the first receiving inductance and the second receiving inductance in a manner wherein at least one of the multiple parallel resonators is grounded through the first receiving inductance and the remainder multiple parallel resonators are grounded through the second receiving inductance, and wherein at least one of the first receiving inductance and the second receiving inductance is connected to more than one of the multiple parallel resonators;
a stacked package with multiple layers, in which the transmit filter and the receive filter are mounted;
a transmitting ground line pattern provided on one of the multiple layers and partially composing the transmitting inductance;
a first receiving ground line pattern provided on one of the multiple layers and partially composing the first receiving inductance; and
a second receiving ground pattern provided on one of the multiple layers and partially composing the second receiving inductance, wherein
the first receiving ground line pattern and the second receiving ground line pattern are provided on different layer;
the second receiving ground line pattern is not provided on the one of the multiple layers on which the first receiving ground line pattern is provided; and
the first receiving ground line pattern is not provided on the one of the multiple layers on which the second receiving ground line pattern is provided.

12. A duplexer comprising:
a transmit filter of a ladder type filter, connected between a common terminal and a transmitting terminal, wherein the transmit filter includes one or more parallel resonators and a transmitting inductance, the one or more parallel resonators being grounded through the transmitting inductance;
a receiver filter of the ladder type filter, connected between the common terminal and a receiving terminal, wherein the receiver filter includes multiple parallel resonators, a first receiving inductance and a second receiving inductance, the multiple parallel resonators being grounded through the first receiving inductance and the second receiving inductance in a manner wherein at least one of the multiple parallel resonators is grounded through the first receiving inductance and the remainder multiple parallel resonators are grounded through the second receiving inductance, and wherein at least one of the first receiving inductance and the second receiving inductance is connected to more than one of the multiple parallel resonators;
a stacked package with multiple layers, in which the transmit filter and the receive filter are mounted;
a transmitting ground line pattern provided on one of the multiple layers and partially composing the transmitting inductance;
a first receiving ground line pattern provided on one of the multiple layers and partially composing the first receiving inductance;
a second receiving ground pattern provided on one of the multiple layers and partially composing the second receiving inductance; and
a common signal line pattern provided on one of the multiple layers to couple the common terminal and either the transmit filter or the receive filter;
a transmitting/receiving signal line pattern provided on one of the multiple layers to couple the transmit filter and the transmitting terminal or to couple the receive filter and the receiving terminal; and
a partition ground line pattern that reduces a bridging capacitance between the common signal line pattern and the transmitting/receiving signal line pattern,
wherein the partition ground line pattern is not disposed in at least one of a region in which the common signal line pattern is provided and a region in which the transmitting/receiving signal line pattern is provided.

13. The duplexer as claimed in claim 12, wherein the partition ground line pattern is arranged at a position that corresponds to the position of the common signal line pattern provided on a different layer from the common signal line pattern.

* * * * *